US012347518B2

(12) United States Patent
Asami et al.

(10) Patent No.: US 12,347,518 B2
(45) Date of Patent: Jul. 1, 2025

(54) MEMORY SYSTEM

(71) Applicant: Kioxia Corporation, Tokyo (JP)

(72) Inventors: Shohei Asami, Yokohama (JP); Yoshihisa Kojima, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 184 days.

(21) Appl. No.: 18/068,914

(22) Filed: Dec. 20, 2022

(65) Prior Publication Data

US 2024/0005969 A1 Jan. 4, 2024

(30) Foreign Application Priority Data

Jul. 1, 2022 (JP) ................................ 2022-107105

(51) Int. Cl.
*G11C 7/10* (2006.01)
*G11C 29/52* (2006.01)

(52) U.S. Cl.
CPC .......... *G11C 7/1096* (2013.01); *G11C 7/1069* (2013.01); *G11C 29/52* (2013.01)

(58) Field of Classification Search
CPC ...... G11C 7/1096; G11C 7/1069; G11C 29/52
USPC .................................................. 365/189.011
See application file for complete search history.

(56) References Cited

U.S. PATENT DOCUMENTS

2011/0149651 A1 6/2011 Gorobets et al.
2021/0286554 A1 9/2021 Gorobets et al.
2021/0295909 A1 * 9/2021 Shirakawa .......... G06F 11/1072
2023/0091134 A1 * 3/2023 Matsuoka ................ G11C 7/18
365/158

* cited by examiner

*Primary Examiner* — Alexander Sofocleous
*Assistant Examiner* — Duy H Luong
(74) *Attorney, Agent, or Firm* — Oblon, McClelland, Maier & Neustadt, L.L.P.

(57) ABSTRACT

According to one embodiment, a memory system includes a semiconductor memory, a controller, and a first circuit. The semiconductor memory includes a nonvolatile memory cell. The controller is configured to cause the semiconductor memory to execute first and second write operations. The first write operation writes a first bit into the memory cell. The second write operation writes first data based on the first bit and a second bit into the memory cell. The first circuit checks whether or not the first bit includes a bit error. The controller is configured to cause the semiconductor memory to execute, in the second write operation, writing of the first data including the second bit and a third bit obtained by correcting the bit error of the first bit, in a case that the first bit includes the bit error.

20 Claims, 27 Drawing Sheets

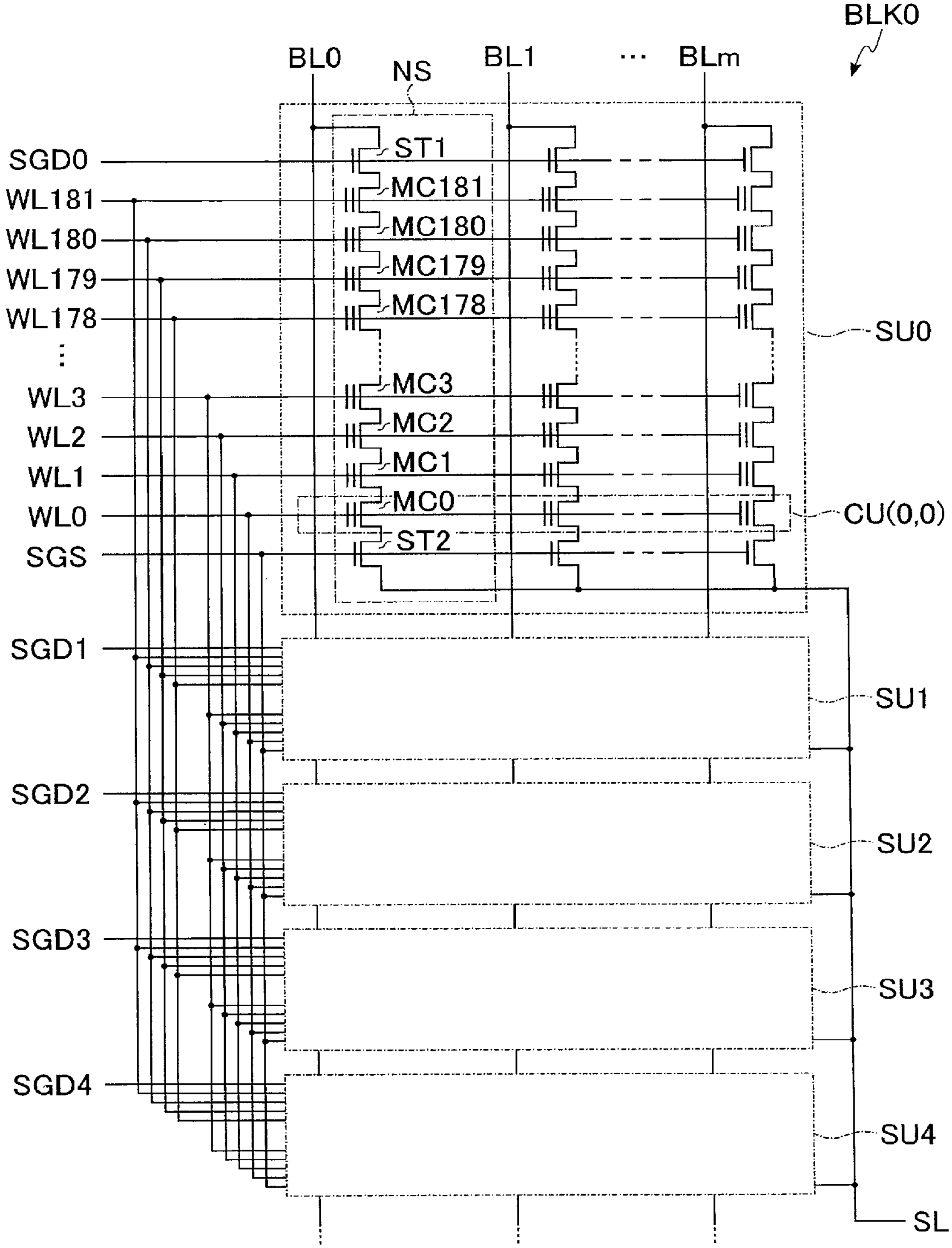
F I G. 3

| Page | Data | | | | | | | | | | | | | | | |
|---|---|---|---|---|---|---|---|---|---|---|---|---|---|---|---|---|
| Top | 1 | 0 | 0 | 1 | 1 | 1 | 1 | 0 | 0 | 0 | 0 | 1 | 1 | 1 | 0 | 0 |
| Upper | 1 | 1 | 0 | 0 | 0 | 1 | 1 | 1 | 1 | 0 | 0 | 0 | 0 | 1 | 1 | 0 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 0 | 0 | 1 | 1 | 0 | 0 | 0 | 0 | 0 | 0 |

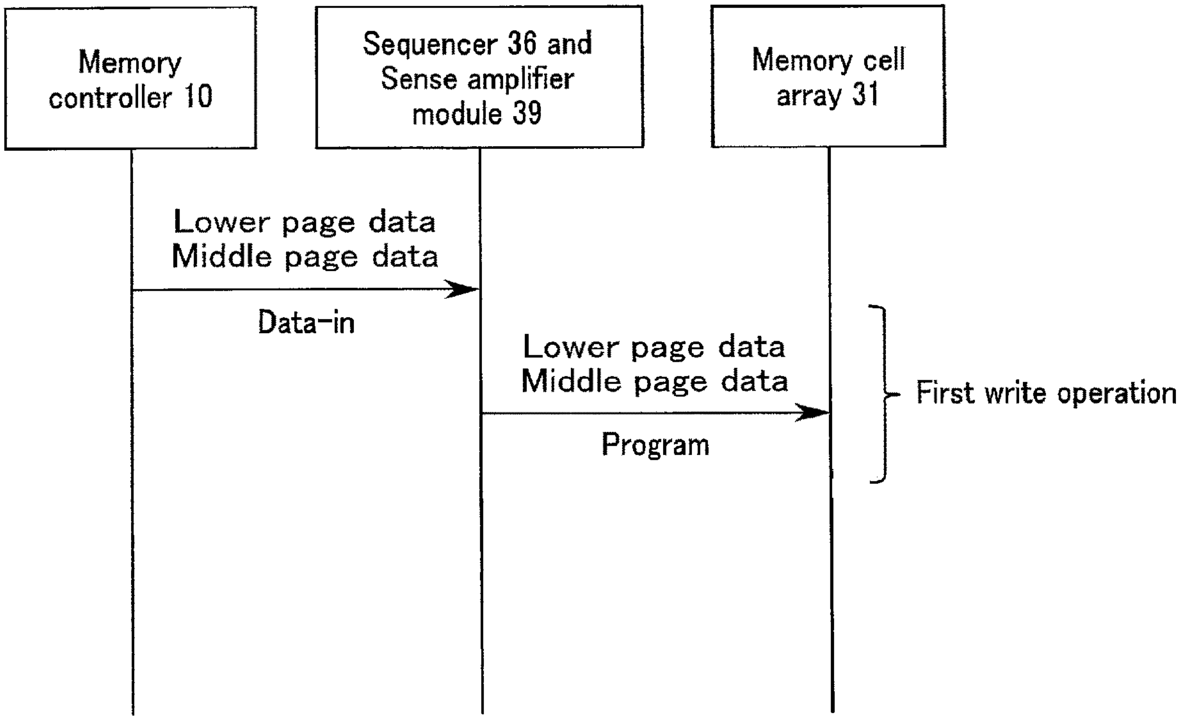
F I G. 5

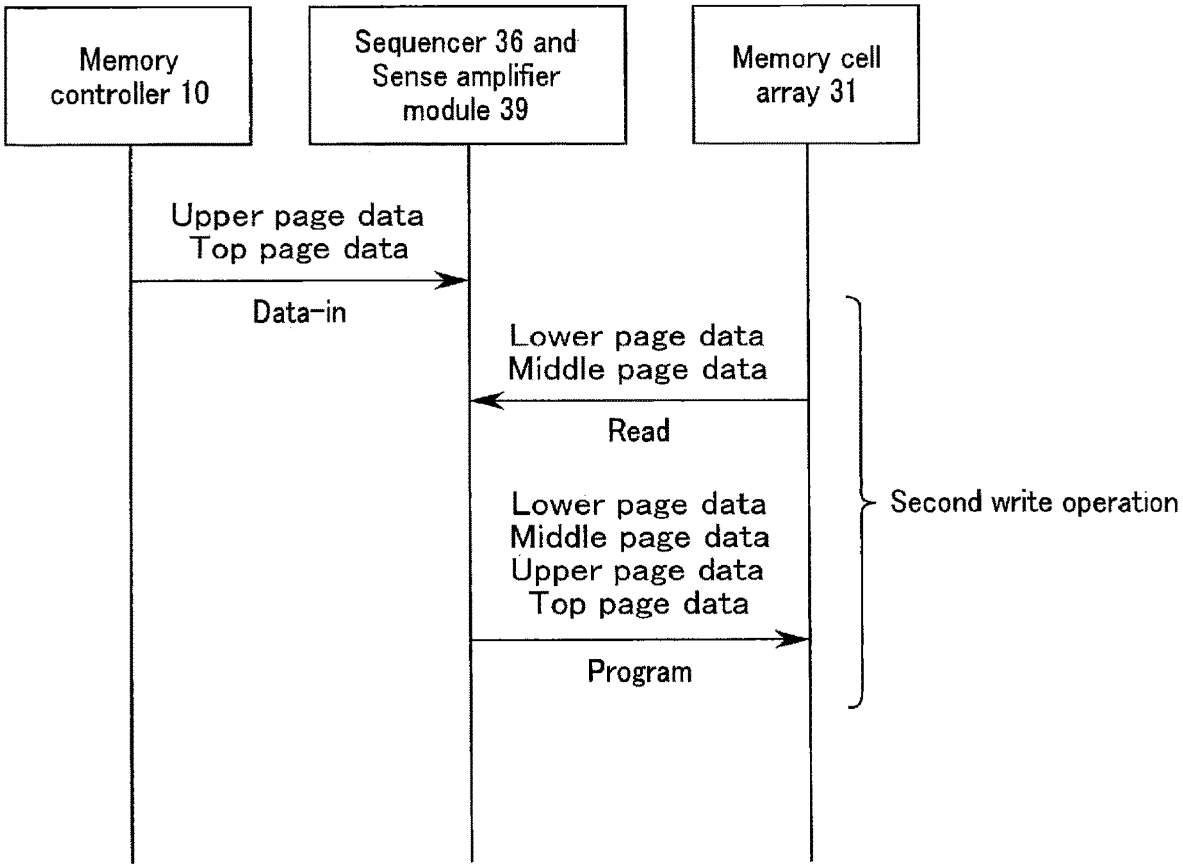
F I G. 7

| Page | Data | | | | | | | | | | | | | | | |
|---|---|---|---|---|---|---|---|---|---|---|---|---|---|---|---|---|
| Top | 1 | 0 | 0 | 1 | 1 | 1 | 1 | 0 | 0 | 0 | 0 | 1 | 1 | 1 | 0 | 0 |
| Upper | 1 | 1 | 0 | 0 | 0 | 1 | 1 | 1 | 1 | 0 | 0 | 0 | 0 | 1 | 1 | 0 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 0 | 0 | 1 | 1 | 0 | 0 | 0 | 0 | 0 | 0 |

| Block BLK | Target CU | Write type |
|---|---|---|
| BLK0 | CU(1,1) | 2 |
| BLK1 | CU(0,2) | 1 |
| | | |

F I G. 10

| Index | Target CU | First write time |
|---|---|---|
| 1 | CU(1,0) | 2022/01/01 0:00:00 |
| 2 | CU(1,1) | 2022/01/01 0:01:00 |
| 3 | CU(1,2) | 2022/01/01 0:03:00 |
| 4 | CU(1,3) | 2022/01/01 0:10:00 |
| 5 | CU(1,4) | 2022/01/01 0:10:30 |
| 6 | CU(2,0) | 2022/01/01 0:11:00 |

F I G. 11

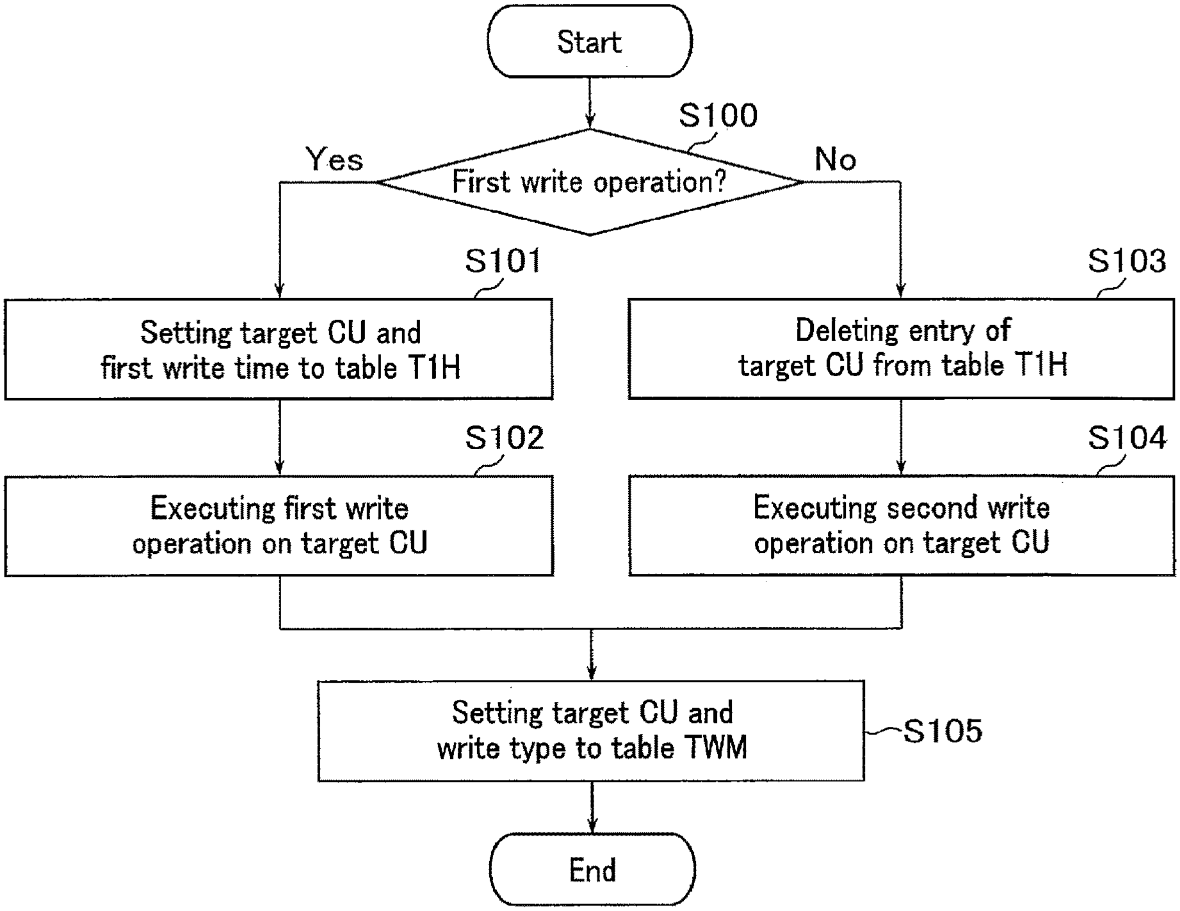
F I G. 12

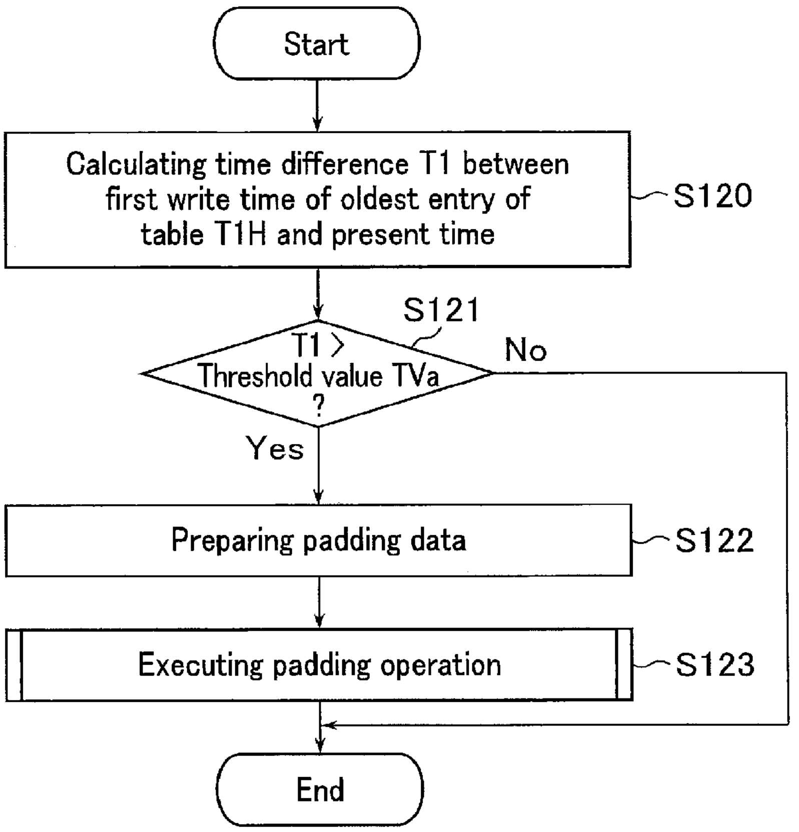
F I G. 13

Data write operation has been executed up to the first write operation on CU(2,1)

Write management table TWM

| Block BLK | Target CU | Write type |
|---|---|---|
| BLK0 | CU(2,1) | 1 |

Write history table T1H

| Index | Target CU | First write time | |
|---|---|---|---|
| 1 | CU(2,1) | 2022/01/01 0:12:00 | |
| 2 | CU(1,1) | 2022/01/01 0:01:00 | ⇐ Oldest entry |
| 3 | CU(1,2) | 2022/01/01 0:03:00 | |
| 4 | CU(1,3) | 2022/01/01 0:10:00 | |
| 5 | CU(1,4) | 2022/01/01 0:10:30 | |
| 6 | CU(2,0) | 2022/01/01 0:11:00 | |

Write order

| | | SU0 | SU1 | SU2 | SU3 | SU4 |
|---|---|---|---|---|---|---|
| WL2 | WRT1 | 16 | 18 | 20 | 22 | 24 |
| WL1 | WRT2 | 17 | 19 | 21 | 23 | 25 |
| WL1 | WRT1 | 6 | 8 | 10 | 12 | 14 |
| WL0 | WRT2 | 7 | 9 | 11 | 13 | 15 |
| WL0 | WRT1 | 1 | 2 | 3 | 4 | 5 |

Padding data to be prepared
  Data (2 pages) for use in second write operation on CU(1,1)

F I G. 14

Data write operation has been executed up to the first write operation on CU(0,2)

Write management table TWM

| Block BLK | Target CU | Write type |
|---|---|---|
| BLK0 | CU(0,2) | 1 |
| | | |

Write history table T1H

| Index | Target CU | First write time | |
|---|---|---|---|
| 1 | CU(0,0) | 2022/01/01 0:00:00 | ⇦ Oldest entry |
| 2 | CU(0,1) | 2022/01/01 0:01:00 | |
| 3 | CU(0,2) | 2022/01/01 0:03:00 | |
| 4 | | | |
| 5 | | | |
| 6 | | | |

Write order

| | | SU0 | SU1 | SU2 | SU3 | SU4 |
|---|---|---|---|---|---|---|
| | | | | | | |
| | | | | | | |
| WL1 | WRT1 | 6 | 8 | 10 | 12 | 14 |
| WL0 | WRT2 | 7 | 9 | 11 | 13 | 15 |
| | WRT1 | 1 | 2 | 3 | 4 | 5 |

Padding data to be prepared
- Data (2 pages) for use in first write operation on CU(0,3)
- Data (2 pages) for use in first write operation on CU(0,4)
- Data (2 pages) for use in first write operation on CU(1,0)
- Data (2 pages) for use in second write operation on CU(0,0)

F I G. 15

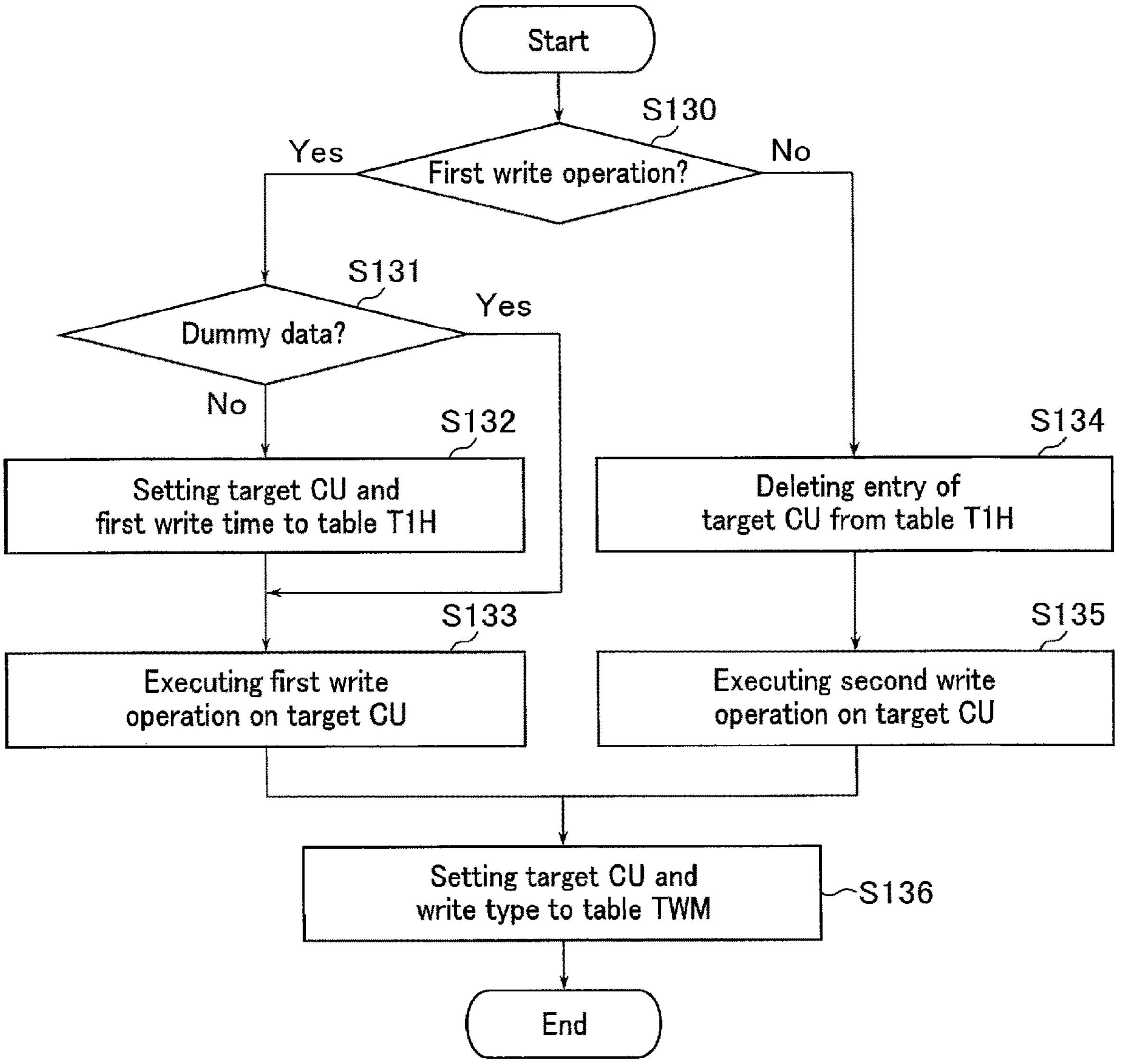
F I G. 16

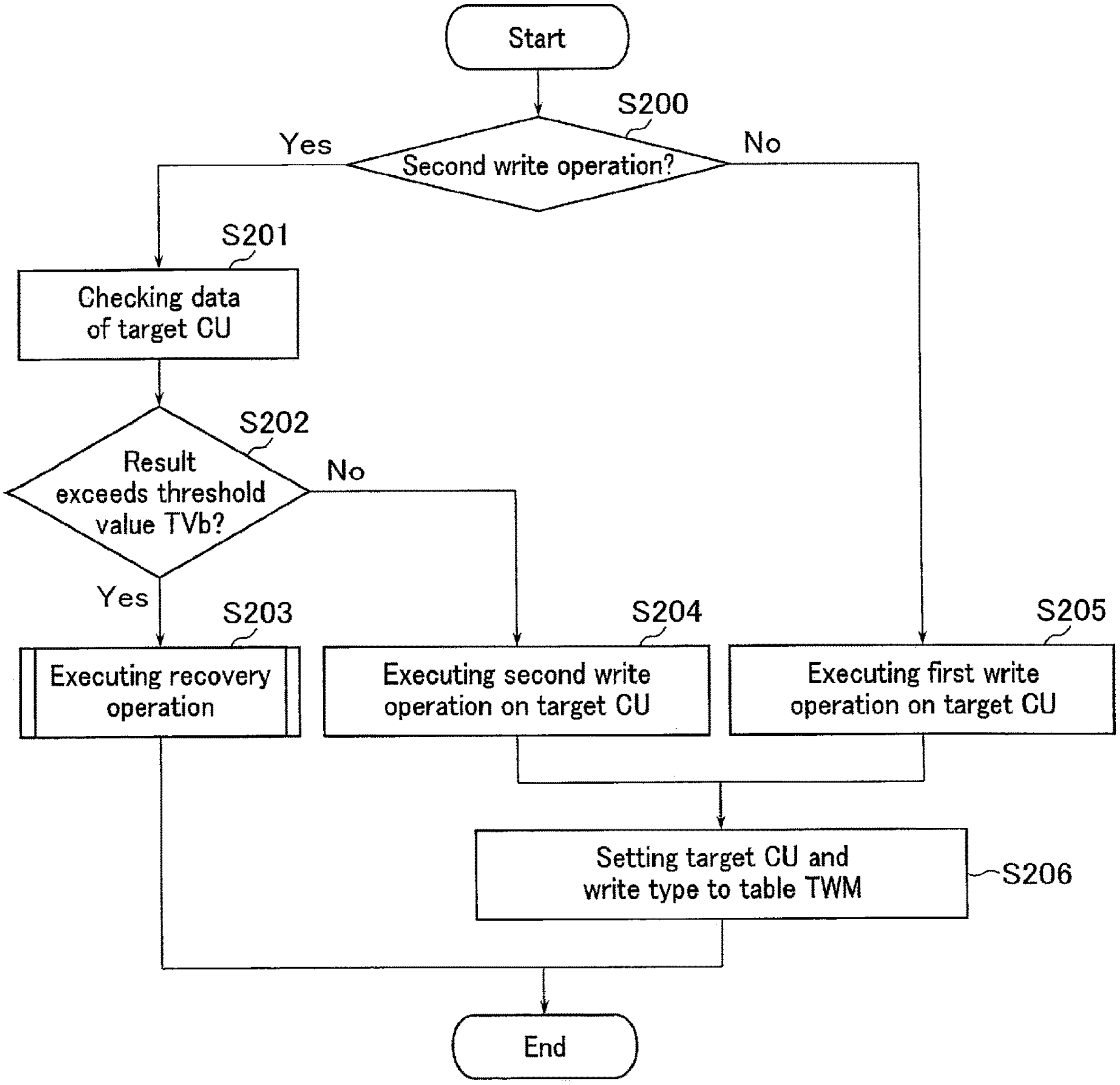
F I G. 19

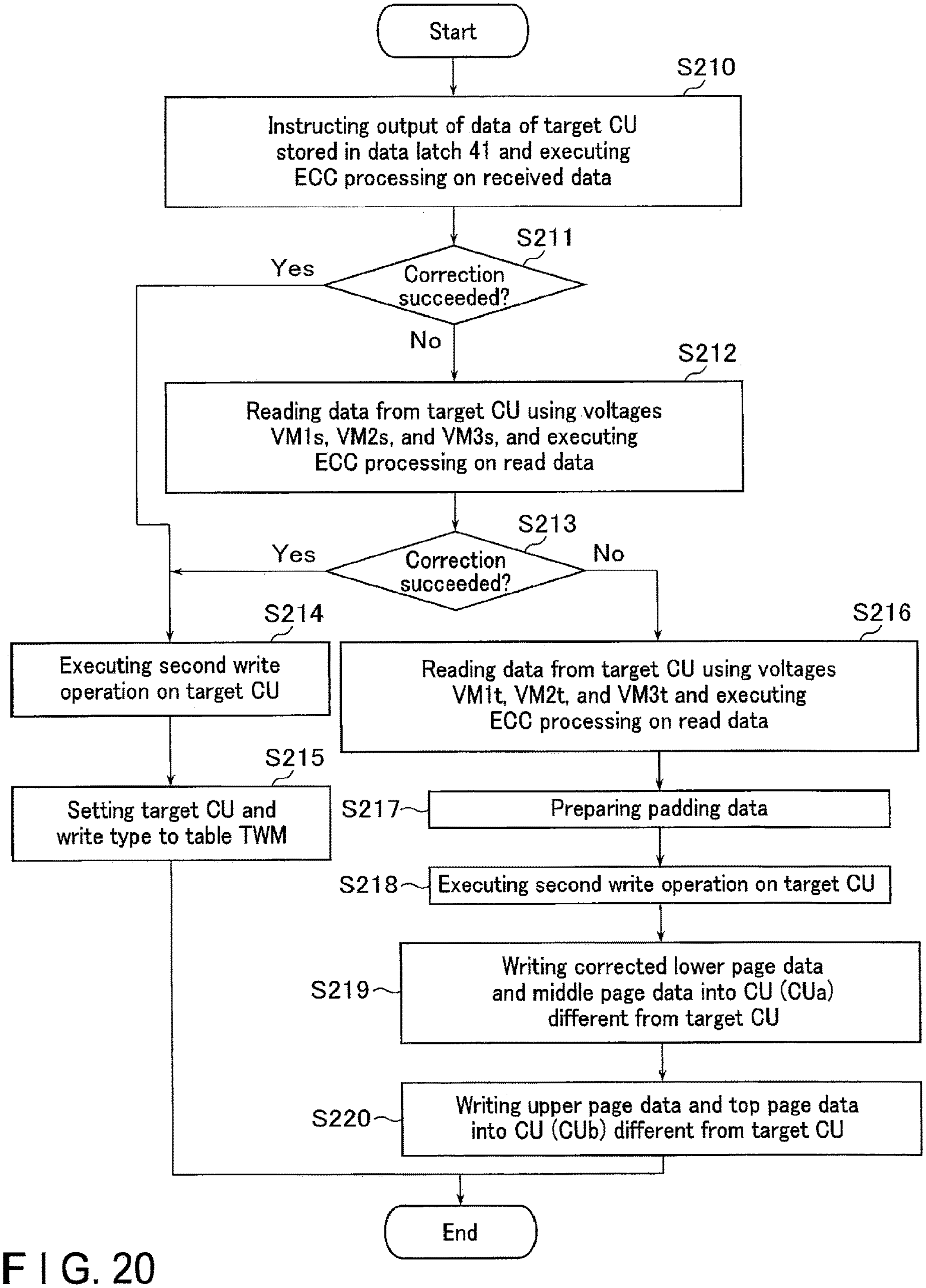
F I G. 20

| Block BLK | Number of writes |
|---|---|
| BLK0 | 100 |
| BLK1 | 100 |
| | |

F I G. 24

| Block BLK | Number of error detections |
|---|---|
| BLK0 | 10 |
| BLK1 | 20 |
| | |

F I G. 26

MEMORY SYSTEM

CROSS-REFERENCE TO RELATED APPLICATIONS

This application is based upon and claims the benefit of priority from Japanese Patent Application No. 2022-107105, filed Jul. 1, 2022, the entire contents of which are incorporated herein by reference.

FIELD

Embodiments described herein relate generally to a memory system.

BACKGROUND

A memory system including a semiconductor memory and a memory controller configured to control the semiconductor memory is known.

BRIEF DESCRIPTION OF THE DRAWINGS

FIG. 3 is a circuit diagram of a memory cell array inside the semiconductor memory included in the memory system according to the first embodiment.

FIG. 5 is a sequence diagram illustrating an example of a first write operation in the memory system according to the first embodiment.

FIG. 7 is a sequence diagram illustrating an example of a second write operation in the memory system according to the first embodiment.

FIG. 10 is a conceptual diagram illustrating an example of a write management table of the memory system according to the first embodiment.

FIG. 11 is a conceptual diagram illustrating an example of a write history table of the memory system according to the first embodiment.

FIG. 12 is a flowchart illustrating an example of a data write operation in the memory system according to the first embodiment.

FIG. 13 is a flowchart illustrating an example of a padding determination operation in the memory system according to the first embodiment.

FIG. 14 is a diagram illustrating an example of a data size for use in a padding operation in the memory system according to the first embodiment.

FIG. 15 is a diagram illustrating another example of a data size for use in the padding operation in the memory system according to the first embodiment.

FIG. 16 is a flowchart illustrating an example of the padding operation in the memory system according to the first embodiment.

FIG. 19 is a flowchart illustrating an example of a data write operation in the memory system according to the second embodiment.

FIG. 20 is a flowchart illustrating an example of a recovery operation in the memory system according to the second embodiment.

FIG. 24 is a conceptual diagram illustrating an example of a number-of-writes table of the memory system according to the third modification of the second embodiment.

FIG. 26 is a conceptual diagram illustrating an example of a number-of-errors table of the memory system according to the fourth modification of the second embodiment.

DETAILED DESCRIPTION

Figure 1:
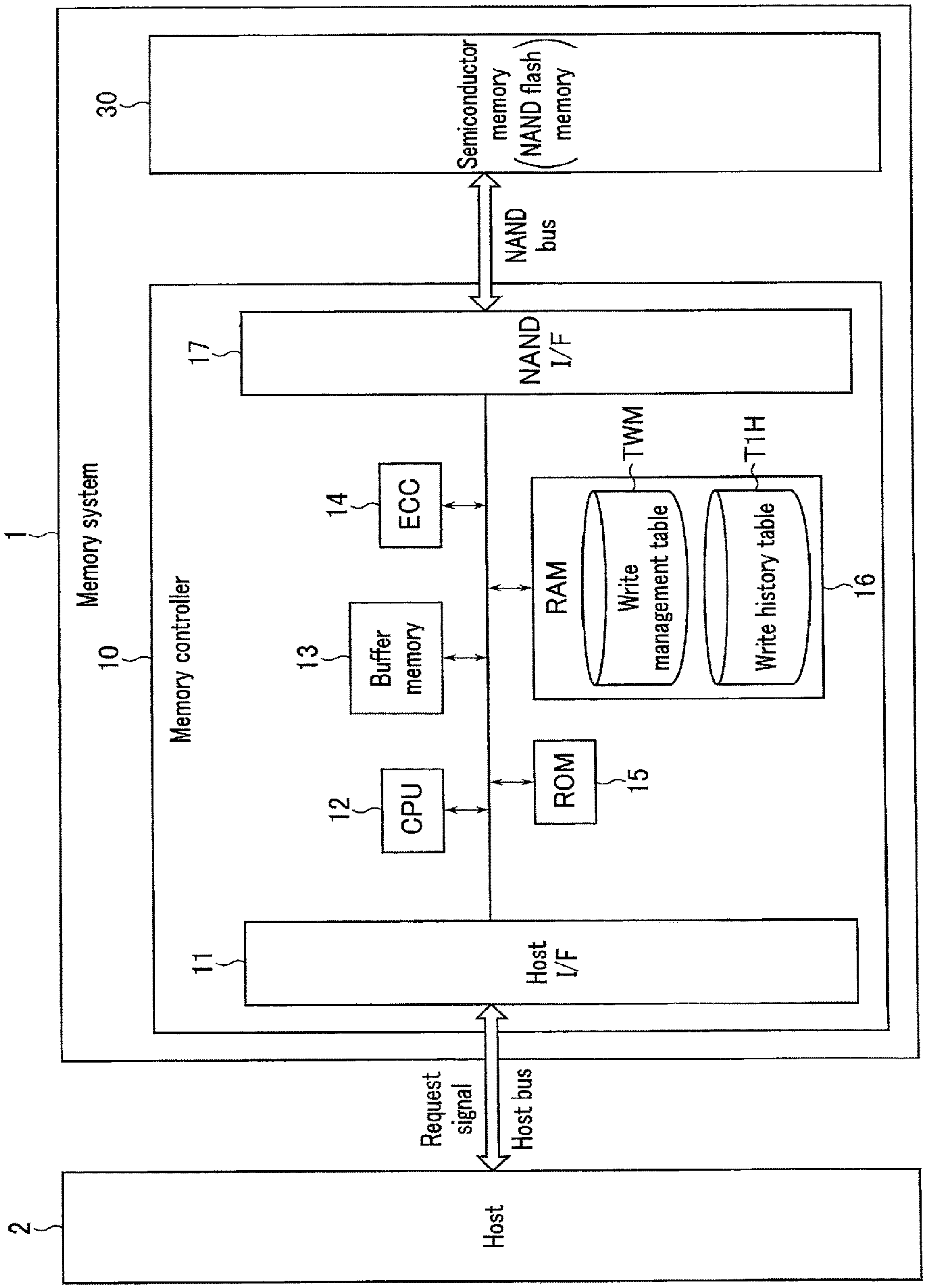
FIG. 1 is a block diagram illustrating an example of an information processing system including a memory system according to a first embodiment.

In general, according to one embodiment, a memory system includes a semiconductor memory, a controller, and a first circuit. The semiconductor memory includes at least one memory cell configured to nonvolatilely store data having at least two bits. The controller is configured to cause the semiconductor memory to execute a first write operation and a second write operation. The first write operation writes a first bit into the memory cell. The second write operation writes first data into the memory cell. The first data has at least two bits based on the first bit read from the memory cell and a second bit. The first circuit checks whether or not the first bit read from the memory cell includes a bit error. The controller is configured to cause the semiconductor memory to execute, in the second write operation, writing of the first data that includes the second bit and a third bit which is obtained by correcting the bit error of the first bit, in a case that the first bit read from the memory cell includes the bit error based on a result of checking by the first circuit.

Hereinafter, embodiments will be described with reference to the accompanying drawings. For the description, common parts are assigned common reference numerals or symbols throughout the drawings.

Each of function blocks may not be categorized as illustrated in the following example. For example, some of functions may be implemented by a function block different from the illustrated function blocks. In addition, the illustrated function blocks may be further divided into smaller function sub-blocks. Embodiments are not limited in accordance with which function block implements the functions.

Each of the function blocks may be implemented in the form of hardware, computer software, or a combination thereof.

1. First Embodiment

A memory system according to a first embodiment will be described. In the following, a memory system including a semiconductor memory such as a NAND flash memory will be described as an example.

1-1. Configuration

1-1-1. Configuration of Memory System

The configuration of the memory system according to the present embodiment will be described with reference to FIG. 1. FIG. 1 is a block diagram illustrating an example of an information processing system including a memory system according to the present embodiment.

The information processing system includes a memory system 1 and a host 2.

The memory system 1 is a device configured to store data. Examples of the memory system 1 include a solid state drive (SSD), a universal flash storage (UFS) device, a universal serial bus (USB) memory, a multi-media card (MMC), and an SD™ card. The memory system 1 can be coupled to the host 2 via a host bus. The memory system 1 performs processing based on a request signal received from the host 2 or an internal processing request.

The host 2 is a device configured to control the memory system 1. Examples of the host 2 include a personal computer, a server system, a mobile device, a vehicle-mounted device, and a digital camera.

Next, the internal configuration of the memory system 1 will be described.

The memory system 1 includes a memory controller 10 and a semiconductor memory 30. The semiconductor memory 30 is, for example, a nonvolatile memory such as a NAND flash memory. In the following, the semiconductor memory 30 will be referred to as a NAND flash memory 30.

The memory controller 10 is a device configured to control the NAND flash memory 30. The memory controller 10 is, for example, a system-on-a-chip (SoC). The memory controller 10 can be coupled to the host 2 via the host bus. The memory controller 10 receives a request signal from the host 2 via the host bus. The type of the host bus depends on an application applied to the memory system 1. In the case of the memory system 1 being the SSD, for example, an interface under the Serial Attached SCSI (SAS), Serial ATA (SATA), or Peripheral Component Interconnect Express (PCIe™) standard is used as the host bus. In the case of the memory system 1 being the UFS device, an interface under the M-PHY standard is used as the host bus. In the case of the memory system 1 being the USB memory, an interface under the USB standard is used as the host bus. In the case of the memory system 1 being the MMC, an interface under the embedded Multi-Media Card (eMMC) standard is used as the host bus. In the case of the memory system 1 being the SD™ card, an interface under the SD™ standard is used as the host bus.

The memory controller 10 controls the NAND flash memory 30 via a NAND bus based on the request signal received from the host 2 or the internal processing request. The NAND bus performs signal transmission/reception in compliance with a NAND interface.

The NAND flash memory 30 is a device configured to store data. The NAND flash memory 30 includes a plurality of memory cell transistors. Each of the memory cell transistors nonvolatilely stores data in accordance with a threshold voltage. The NAND flash memory 30 nonvolatilely stores data received from the memory controller 10 in the plurality of memory cell transistors. The NAND flash memory 30 outputs data read from the plurality of memory cell transistors to the memory controller 10.

Next, the internal configuration of the memory controller 10 will be described.

The memory controller 10 includes a host interface (I/F) circuit 11, a processor (e.g., Central Processing Unit: CPU) 12, a buffer memory 13, an error checking and correcting (ECC) circuit 14, a read-only memory (ROM) 15, a random-access memory (RAM) 16, and a NAND interface (I/F) circuit 17.

The host interface circuit 11 is a circuit configured to control communications between the memory controller 10 and the host 2. The host interface circuit 11 can be coupled to the host 2 via the host bus.

The processor 12 is a control circuit of the memory controller 10. The processor 12 controls the overall operation of the memory controller 10 by executing a program (firmware) stored in the ROM 15. For example, upon receipt of a write request from the host 2, the processor 12 controls a data write operation based on the received write request. Similar processing is performed in a data read operation and a data erase operation.

The buffer memory 13 is a memory configured to temporarily store data. The buffer memory 13 is, for example, a static random-access memory (SRAM). The buffer memory 13 temporarily stores write data, read data, etc. The write data is data that is to be written into the NAND flash memory 30. The read data is data that is read from the NAND flash memory 30.

The ECC circuit 14 is a circuit configured to perform error checking and correcting (ECC) processing on data. Specifically, the ECC circuit 14 generates an error correction code based on write data in a data write operation. In a data read operation, the ECC circuit 14 detects an error by generating a syndrome based on the error correction code in a predetermined unit and corrects the detected error.

The ROM 15 is a nonvolatile memory. The ROM 15 is, for example, an electrically erasable programmable read-only memory (EEPROM). The ROM 15 stores programs such as the firmware.

The RAM 16 is a volatile memory. The RAM 16 is, for example, an SRAM. The RAM 16 is used as a work area of the processor 12. The RAM 16 stores the firmware for managing the NAND flash memory 30, and various types of management information. The RAM 16 stores, for example, a write management table TWM and a write history table T1H. The write management table TWM and the write history table T1H will be described later in detail.

The NAND interface circuit 17 is a circuit configured to control communications between the memory controller 10 and the NAND flash memory 30. The NAND interface circuit 17 is coupled to the NAND flash memory 30 via the NAND bus. For example, the NAND interface circuit 17 controls transfer of data, commands, addresses, etc., between the memory controller 10 and the NAND flash memory 30.

1-1-2. Configuration of NAND Flash Memory

Figure 2:
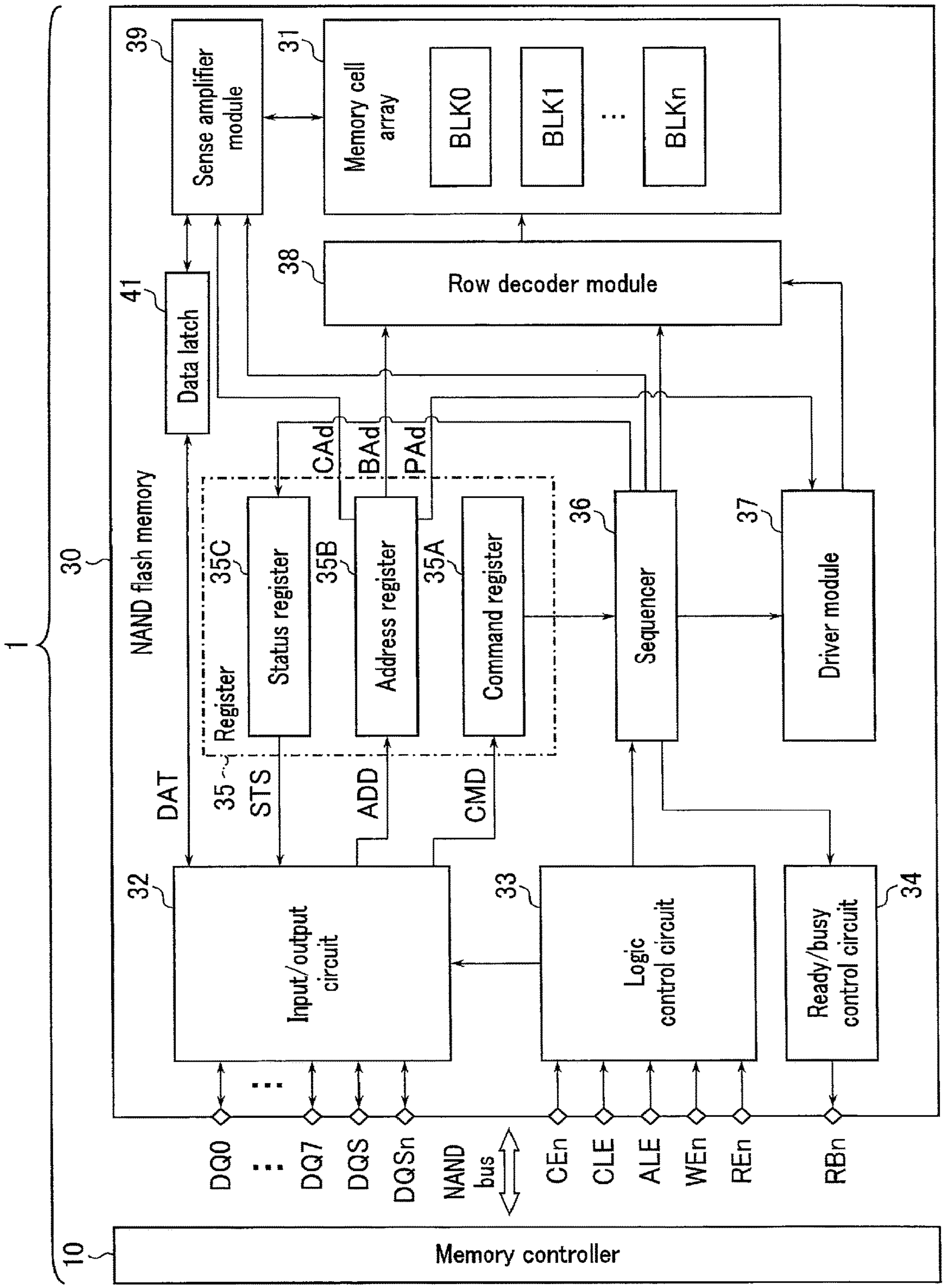
FIG. 2 is a block diagram illustrating an example of the configuration of a semiconductor memory included in the memory system according to the first embodiment.

The configuration of the NAND flash memory 30 will be described with reference to FIG. 2. FIG. 2 is a block diagram illustrating an example of the configuration of the NAND flash memory 30. The NAND flash memory 30 includes a memory cell array 31, an input/output circuit 32, a logic control circuit 33, a ready/busy control circuit 34, a register 35, a sequencer 36, a driver module 37, a row decoder module 38, a sense amplifier module 39, and a data latch 41.

The memory cell array 31 includes a plurality of blocks BLK0 to BLKn (where n is an integer equal to or larger than 1). The block BLK is, for example, a set of memory cell transistors from which data is erased collectively. The block BLK is, for example, used as a unit of a data erase operation. The block BLK includes a plurality of word lines. Each of the memory cell transistors can nonvolatilely store data. A plurality of bit lines and the plurality of word lines are provided in the memory cell array 31. Each of the memory cell transistors is associated with, for example, a single bit line and a single word line. The memory cell array 31 will be described later in detail.

The input/output circuit 32 is a circuit configured to transmit and receive signals and information to and from the memory controller 10. The input/output circuit 32 transmits and receives an input/output signal DQ (for example, 8-bit signals DQ0 to DQ7) and a data strobe signal DQS and a data strobe signal DQSn (an inversion signal of the signal DQS) to and from the memory controller 10. The signal DQ is an entity of data transmitted and received between the NAND flash memory 30 and the memory controller 10. Examples of the signal DQ include, for example, a command CMD, an address ADD, status information STS, and data DAT. The signals DQS and DQSn are signals for controlling a timing of transmitting and receiving the signal DQ. For example, when data is written, the signals DQS and DQSn along with the signal DQ including write data are transmitted from the memory controller 10 to the NAND flash memory 30. The NAND flash memory 30 receives the signal DQ including the write data in synchronization with the signals DQS and DQSn. When data is read, the signals DQS and DQSn along with the signal DQ including read data are transmitted from the NAND flash memory 30 to the memory controller 10. The memory controller receives the signal DQ including the read data in synchronization with the signals DQS and DQSn. The input/output circuit 32 may receive the signals DQS and DQSn from the memory controller 10 via the logic control circuit 33.

The input/output circuit 32 transmits a command CMD in the signal DQ to a command register 35A. The input/output circuit 32 transmits an address ADD in the signal DQ to an address register 35B. The input/output circuit 32 receives status information STS from a status register 35C. The input/output circuit 32 transmits and receives data DAT in the signal DQ to and from the sense amplifier module 39.

The logic control circuit 33 is a circuit configured to control the input/output circuit 32 and the sequencer 36 based on a control signal. The logic control circuit 33 receives, from the memory controller 10, a chip enable signal CEn, a command latch enable signal CLE, an address latch enable signal ALE, a write enable signal WEn, and a read enable signal REn. The signal CEn is a signal for enabling the NAND flash memory 30. The signal CLE is a signal indicating that the signal DQ received by the NAND flash memory 30 is a command CMD. The signal ALE is a signal indicating that the signal DQ received by the NAND flash memory 30 is an address ADD. The signal WEn is a signal instructing the NAND flash memory 30 to input the signal DQ. The signal REn is a signal instructing the NAND flash memory 30 to output the signal DQ. The NAND flash memory 30 generates the signals DQS and DQSn based on the signal REn. The NAND flash memory 30 outputs the signal DQ to the memory controller 10 based on the generated signals DQS and DQSn. The logic control circuit 33 controls the input/output circuit 32 and the sequencer 36 based on the received signal.

The ready/busy control circuit 34 is a circuit configured to notify the memory controller 10 of an operation status of the sequencer 36. The ready/busy control circuit 34 transmits a ready/busy signal RBn to the memory controller 10 in accordance with the operation status of the sequencer 36. The signal RBn is a signal indicative of whether the NAND flash memory 30 is in a ready state or a busy state. The signal RBn is set to a high level, for example, when the NAND flash memory 30 is in the ready state. The ready state is a state in which the NAND flash memory 30 can receive a command from the memory controller 10. The signal RBn is set to a low level, for example, when the NAND flash memory 30 is in the busy state. The busy state is a state in which the NAND flash memory 30 cannot receive a command from the memory controller 10.

The register 35 is a circuit configured to temporarily store information. The register 35 includes the command register 35A, the address register 35B, and the status register 35C.

The command register 35A is a circuit configured to store a command CMD. The command CMD includes, for example, an instruction to cause the sequencer 36 to execute a data read operation, a data write operation, and a data erase operation.

The address register 35B is a circuit configured to store an address ADD. The address ADD includes, for example, a block address BAd, a page address PAd, and a column address CAd. The block address BAd, the page address PAd, and the column address CAd are used to select, for example, a block BLK, a word line, and a bit line, respectively.

The status register 35C is a circuit configured to temporarily store, for example, status information STS of a data read operation, a data write operation, and a data erase operation. The status information STS is used to notify the memory controller 10 of whether or not the operation has been completed normally.

The sequencer 36 is a circuit configured to control an operation of another circuit in accordance with a predetermined program. The sequencer 36 controls the overall operation of the NAND flash memory 30. For example, the sequencer 36 controls the ready/busy control circuit 34, the driver module 37, the row decoder module 38, and the sense amplifier module 39 based on a command CMD stored in the command register 35A. For example, the sequencer 36 executes a data read operation, a data write operation, and a data erase operation.

The driver module 37 is a circuit configured to generate a voltage for use in a data read operation, a data write operation, and a data erase operation. The driver module 37 applies the generated voltage to a signal line corresponding to a selected word line based on a page address PAd stored in the address register 35B.

The row decoder module 38 is a circuit configured to select, based on a block address BAd stored in the address register 35B, one of the blocks BLK in the memory cell array 31. The row decoder module 38 transfers the voltage applied to the signal line corresponding to the selected word line to the selected word line in the selected block BLK.

In a data write operation, the sense amplifier module 39 applies a voltage which is based on write data DAT received from the input/output circuit 32 via the data latch 41, to a bit line. In a data read operation, the sense amplifier module 39 determines data stored in a memory cell transistor based on the voltage of the bit line. The sense amplifier module 39 transfers the determination result as read data DAT to the input/output circuit 32 via the data latch 41.

The data latch 41 includes a plurality of latch circuits (not shown). Each of the latch circuits temporarily stores write data or read data. For example, in a data write operation, the data latch 41 temporarily stores the write data received from the input/output circuit 32, and transmits the write data to the sense amplifier module 39. Furthermore, in a data read operation, the data latch 41 temporarily stores the read data received from the sense amplifier module 39, and transmits the read data to the input/output circuit 32.

1-1-3 Circuit Configuration of Memory Cell Array

The circuit configuration of the memory cell array 31 will be described with reference to FIG. 3. FIG. 3 is a circuit diagram of the memory cell array 31. FIG. 3 illustrates the circuit configuration of a block BLK0 included in the memory cell array 31, as an example of the circuit configuration of the memory cell array 31. The other blocks BLK have similar configurations to that illustrated in FIG. 3.

The block BLK includes, for example, five string units SU0 to SU4. Each of the string units SU is, for example, a set of NAND strings NS which are selected collectively in a data write operation or a data read operation. Each of the string units SU includes a plurality of NAND strings NS respectively associated with bit lines BL0 to BLm (m is an integer equal to or larger than 1). Each of the NAND strings NS is a set of memory cell transistors coupled in series. Each of the NAND strings NS includes, for example, memory cell transistors MC0 to MC181 and select transistors ST1 and ST2. Each of the memory cell transistors MC nonvolatilely stores data. Each of the memory cell transistors MC includes a control gate and a charge storage layer. The select transistors ST1 and ST2 are switching elements. Each of the select transistors ST1 and ST2 is used to select a string unit SU in various operations.

In each of the NAND strings NS, the memory cell transistors MC0 to MC181 are coupled in series. A drain of the select transistor ST1 is coupled to a bit line BL associated therewith. A source of the select transistor ST1 is coupled to one end of the memory cell transistors MC0 to MC181 coupled in series. A drain of the select transistor ST2 is coupled to the other end of the memory cell transistors MC0 to MC181 coupled in series. A source of the select transistor ST2 is coupled to a source line SL.

Control gates of the memory cell transistors MC0 to MC181 in the same block BLK are respectively coupled in common to word lines WL0 to WL181. Gates of the select transistors ST1 in the string units SU0 to SU4 are respectively coupled in common to select gate lines SGD0 to SGD4. Gates of the select transistors ST2 included in the same block BLK are coupled in common to a select gate line SGS.

In the circuit configuration of the memory cell array 31 described in the above, the bit line BL is shared by, for example, the NAND strings NS to which the same column address CAd is assigned in the respective string units SU. The source line SL is shared by, for example, the plurality of blocks BLK.

A set of memory cell transistors MC coupled to a common word line WL in one string unit SU is referred to as, for example, a cell unit CU. Each of the blocks BLK includes a plurality of cell units CU. Hereinafter, a cell unit CU, which corresponds to a pair of one of the word lines WL (word line WLi) and one of the string units SU (string unit SUj), will be referred to as a cell unit CU (i,j) (i is an integer equal to or larger than 0 and equal to or smaller than 181, whereas j is an integer equal to or larger than 0 and equal to or smaller than 4). In the case where the cell units CU (i,j) are not distinguished from each other, they will simply be referred to as a cell unit CU. Data stored in a cell unit CU that includes the plurality of memory cell transistors MC each storing 1-bit data in accordance with a threshold voltage is equivalent to 1-page data. The cell unit CU may store 2-page or more data based on the number of bits of data stored in the memory cell transistor MC. In the present embodiment, one memory cell transistor MC can store 4-bit data. That is, the memory cell transistor MC according to the present embodiment is a quad-level cell (QLC) configured to store 4-bit data. In this case, data stored in the cell unit CU is equivalent to 4-page data.

The number of bits of data that the memory cell transistor MC can store is not limited to 4 bits. The present embodiment is applicable to a memory cell transistor MC that can store data of multiple bits, that is, two bits or more. For example, the memory cell transistor MC may be a multi-level cell (MLC) configured to store 2-bit data, may be a triple-level cell (TLC) configured to store 3-bit data, or may be a penta-level cell (PLC) configured to store 5-bit data.

In addition, the circuit configuration of the memory cell array 31 is not limited to the configuration described in the above. For example, the number of string units SU included in each block BLK and the number of memory cell transistors MC and select transistors ST1 and ST2 included in each NAND string NS may be set freely. Hereinafter, the memory cell transistor MC will also be referred to as a memory cell MC.

1-1-4 Threshold Voltage Distributions of Memory Cells

Figure 4:
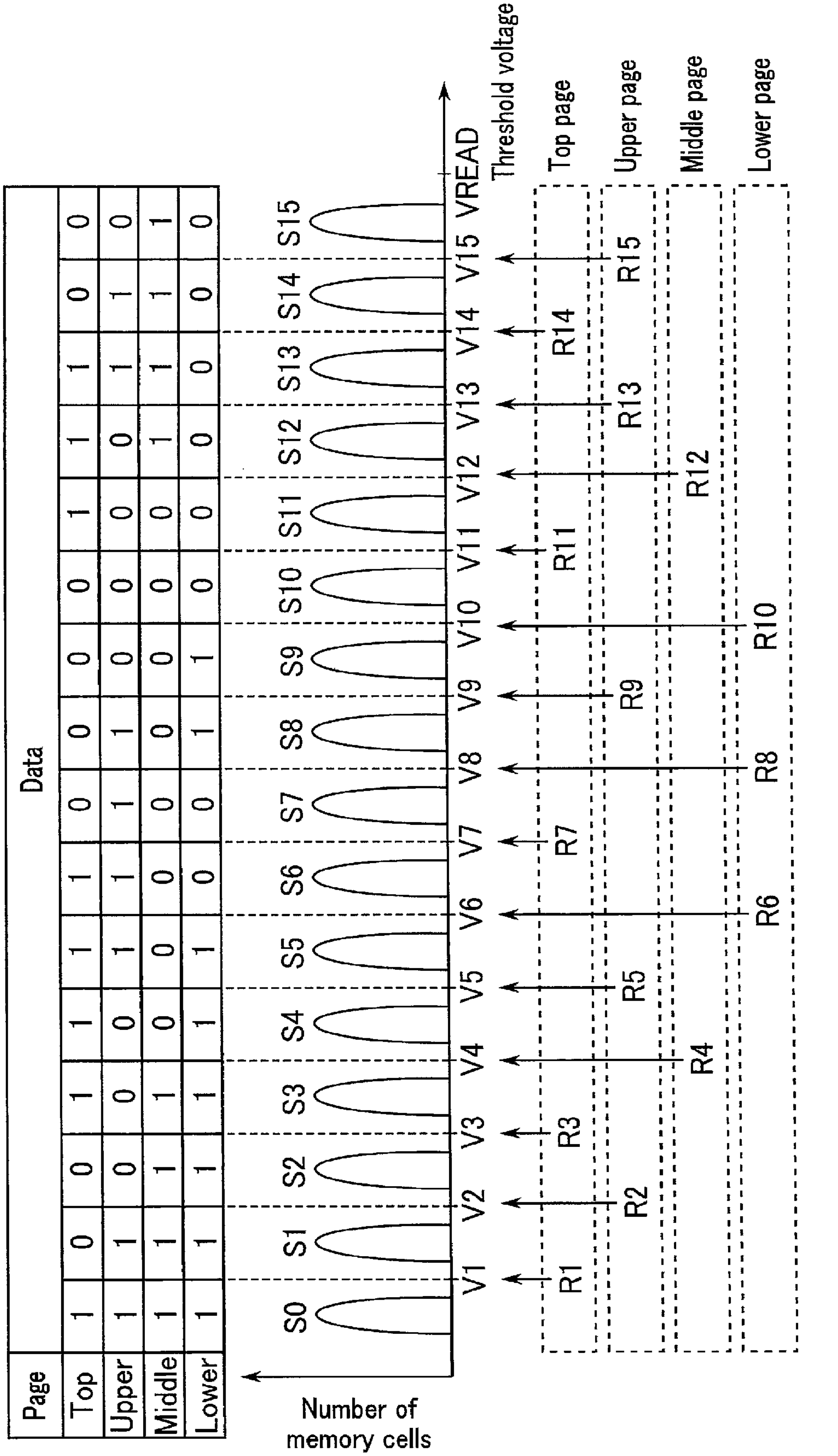
FIG. 4 is a diagram illustrating an example of a relationship between threshold voltage distributions of memory cell transistors and data stored therein, which memory cell transistors are included in the memory system according to the first embodiment.

The threshold voltage distributions to which the memory cells MC may belong will be described with reference to FIG. 4. FIG. 4 is a diagram illustrating an example of a relationship between threshold voltage distributions of the memory cells MC and data stored in the memory cells MC. The lateral axis in FIG. 4 indicates the threshold voltages of the memory cells MC. The vertical axis in FIG. 4 indicates the number of memory cells MC.

As illustrated in FIG. 4, in the case of the memory cells MC each configured to store 4-bit data, their threshold voltage distributions are divided into 16. These 16 threshold voltage distributions will be referred to as an "S0" state to an "S15" state, from lower to higher threshold voltages.

In addition, voltages V1 to V15 are voltages (hereinafter, referred to as a "verify voltage") used to verify the "S1" state to the "S15" state, respectively, in a data write operation. The voltage VREAD is a voltage that is applied to a non-selected word line WL in a data read operation. When the voltage VREAD is applied to a gate of a memory cell MC, the memory cell MC is turned to an ON state regardless of data stored therein. A relationship between these voltages is expressed as $V1<V2<V3<V4<V5<V6<V7<V8<V9<V10<V11<V12<V13<V14<V15<VREAD$.

The "S0" state corresponds to a state in which data has been erased from the memory cell MC. Each of the "S1" state to the "S15" state corresponds to a state in which data is written by injecting electric charge into the charge storage layer of the memory cell MC. The threshold voltages of the memory cells MC included in the "S0" state are lower than the voltage V1. The threshold voltages of the memory cells MC included in the "S1" to "S14" states are equal to or higher than the voltages V1 to V14 and lower than the voltages V2 to V15, respectively. The threshold voltages of the memory cells MC included in the "S15" state are equal to or higher than the voltage V15 and smaller than the voltage VREAD.

The verify voltage and a read voltage corresponding to each of the states may have the same set value or different set values. To simplify the description, a case will be described below where a set values of the verify voltage and a set values of the read voltage are the same.

Hereinafter, data read operations using the voltages V1 to V15 will be respectively referred to as data read operations R1 to R15. The data read operation R1 determines whether or not the threshold voltage of the memory cell MC is lower than the voltage V1. The data read operation R2 determines whether or not the threshold voltage of the memory cell MC is lower than the voltage V2. The data read operation R3 determines whether or not the threshold voltage of the memory cell MC is lower than the voltage V3. The same applies to the subsequent data read operations.

As stated above, each of the memory cells MC belongs to one of the 16 threshold voltage distributions, thereby belonging to a corresponding one of the 16 states. By assigning "0000" to "1111" in binary numbers to these states, each of the memory cells MC can store 4-bit data. Hereinafter, bits constituting 4-bit data will be referred to as a lower bit, a middle bit, an upper bit, and a top bit in order from the least significant bit. A set of lower bits stored in the memory cells MC included in the same cell unit CU will be referred to as a lower page, a set of middle bits stored in the memory cells MC included in the same cell unit CU will be referred to as a middle page, a set of upper bits stored in the memory cells MC included in the same cell unit CU will be referred to as an upper page, and a set of top bits stored in the memory cells MC included in the same cell unit CU will be referred to as a top page.

In the example illustrated in FIG. 4, with respect to the "lower bit/middle bit/upper bit/top bit" of each of the memory cells MC included in each of the states, data is allocated as described below.

"S0" state: "1111" data
"S1" state: "1110" data
"S2" state: "1100" data
"S3" state: "1101" data
"S4" state: "1001" data
"S5" state: "1011" data
"S6" state: "0011" data
"S7" state: "0010" data
"S8" state: "1010" data
"S9" state: "1000" data
"S10" state: "0000" data
"S11" state: "0001" data
"S12" state: "0101" data
"S13" state: "0111" data
"S14" state: "0110" data
"S15" state: "0100" data Note that data allocated to the respective states is not limited to this example.

In the case of reading data allocated in this manner, the lower bit is determined through the data read operations R6, R8, and R10. The middle bit is determined through the data read operations R4 and R12. The upper bit is determined through the data read operations R2, R5, R9, R13, and R15. The top bit is determined through the data read operations R1, R3, R7, R11, and R14.

1-2 Data Write Operation

Next, the data write operation will be described. In the following, first, an overview of the data write operation will be described.

1-2-1 Overview of Data Write Operation

The data write operation includes a program operation and a verify operation. A threshold voltage of the memory cell MC is raised to a target level by repeating the program operation and the verify operation in combination.

The program operation indicates an operation of raising a threshold voltage by injecting electrons into the charge storage layer (or maintaining a threshold voltage by inhibiting the injection). In the following, an operation of raising a threshold voltage will be referred to as a "'0' program". For example, raising the threshold voltage of a memory cell MC included in the "S0" state to be included in the "S1" state will be referred to as the "0" program. To the bit line BL which is subject to the "0" program, a voltage (for example, a voltage VSS) for the "0" program is supplied from the sense amplifier module 39. On the other hand, an operation of maintaining a threshold voltage will be referred to as a "'1' program" or "write inhibit". To the bit line BL which is subject to the "1" program, a voltage for the "1" program is supplied from the sense amplifier module 39.

The verify operation is an operation of reading data after the program operation, and determining whether or not the threshold voltage of a memory cell MC has reached a target level. Writing data to the memory cell MC whose threshold voltage has reached the target level is inhibited.

In the present embodiment, the data write operation described above is divided into two and executed separately. Specifically, the data write operation of 4-page data corresponding to a cell unit CU is divided into two: a data write operation of the lower page and the middle page (hereinafter, referred to as a "first write operation"); and a data write operation of the upper page and the top page (hereinafter, referred to as a "second write operation"), which are executed separately.

1-2-2 First Write Operation

First, the first write operation will be described with reference to FIG. 5. FIG. 5 is a sequence diagram illustrating an example of the first write operation. In FIG. 5, the verify operation is omitted.

As illustrated in FIG. 5, the memory controller 10 causes the sequencer 36 to execute the first write operation. The sequencer 36 executes the first write operation based on the lower page data and the middle page data input from the memory controller 10 to the sense amplifier module 39. In other words, the first write operation is an operation of writing the lower bits included in the lower page data and the middle bits included in the middle page data into the respective memory cells MC within a cell unit CU.

Figure 6:
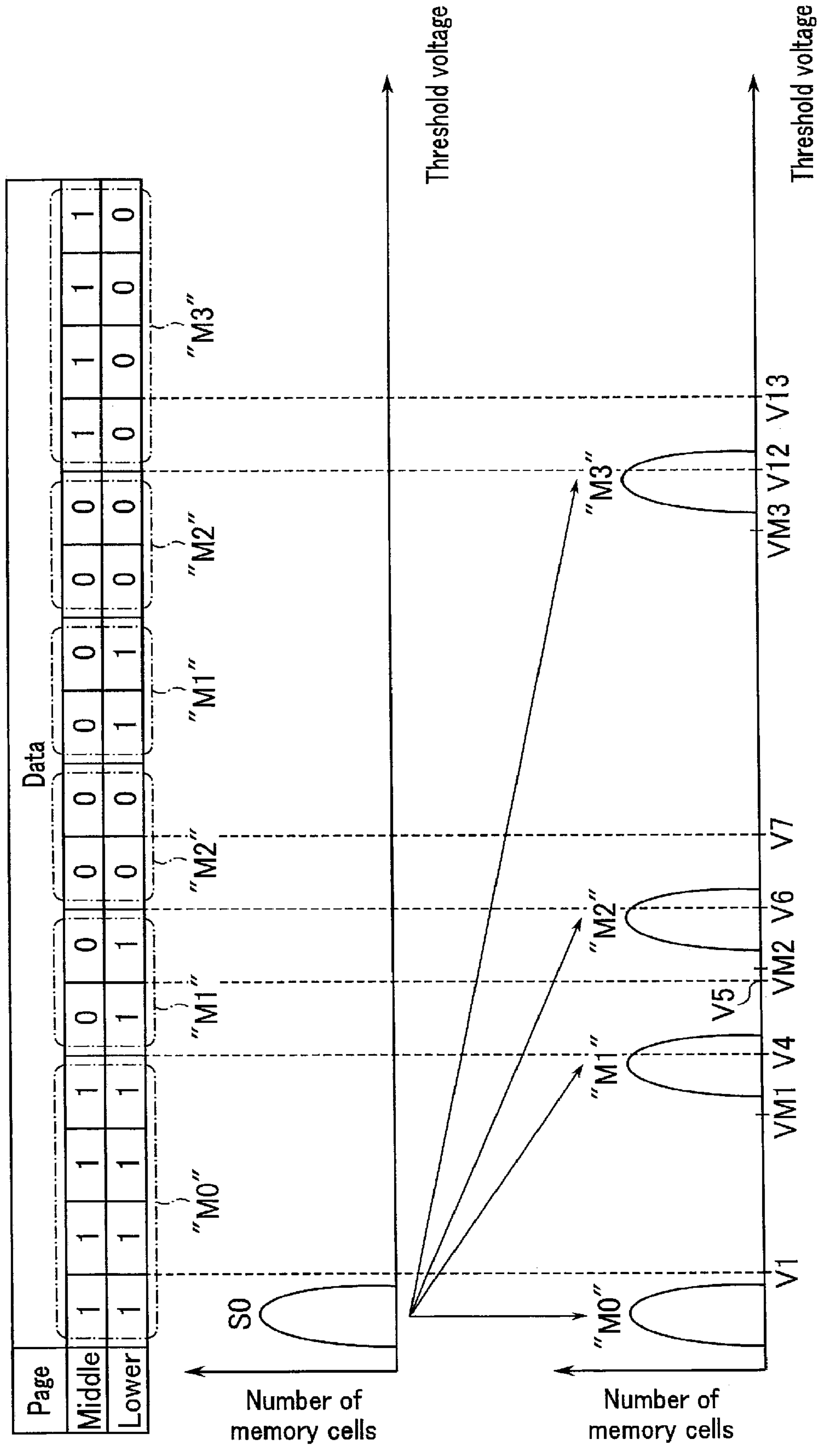
FIG. 6 is a diagram illustrating changes in threshold voltage distributions of the memory cell transistors caused by the first write operation in the memory system according to the first embodiment.

When the first write operation is executed, the threshold voltage of the memory cell MC rises based on the write data, and four threshold voltage distributions are formed. FIG. 6 is a diagram illustrating changes in threshold voltage distributions of the memory cells MC caused by the first write operation. As illustrated in FIG. 6, an "M0" state, an "M1" state, an "M2" state, and an "M3" state are formed through the first write operation. As illustrated in FIG. 6, for example, in the first write operation, the "M0" state is formed by a plurality of memory cells MC into which "11" data is written. Herein, the expression of "kh" data indicates that the lower bit is "k" data and the middle bit is "h" data.

The "M1" state is formed by a plurality of memory cells MC into which "10" data is written. The "M2" state is formed by a plurality of memory cells MC into which "00" data is written. The "M3" state is formed by a plurality of memory cells MC into which "01" data is written.

More specifically, the sequencer 36 uses voltages VM1, VM2, and VM3 as a verify voltage. The voltage VM1 is a verify voltage for use in the case of writing "10" data and is equal to or higher than the voltage V1 and lower than the voltage V4. The voltage VM2 is a verify voltage for use in the case of writing "00" data and is equal to or higher than the voltage V4 and lower than the voltage V6. The voltage VM3 is a verify voltage for use in the case of writing "01" data and is equal to or higher than the voltage V6 and lower than the voltage V12.

Threshold voltages included in the "M0" state are lower than the voltage V1. Threshold voltages included in the "M1" state are equal to or higher than the voltage VM1 and lower than the voltage V5. Threshold voltages included in the "M2" state are equal to or higher than the voltage VM2 and lower than the voltage V7. Threshold voltages included in the "M3" state are equal to or higher than the voltage VM3 and lower than the voltage V13.

1-2-3 Second Write Operation

Next, the second write operation will be described with reference to FIG. 7. FIG. 7 is a sequence diagram illustrating an example of the second write operation. In FIG. 7, the verify operation is omitted.

As illustrated in FIG. 7, the memory controller 10 causes the sequencer 36 to execute the second write operation. The sequencer 36 executes the second write operation based on the upper page data and the top page data input from the memory controller 10 to the sense amplifier module 39, and the lower page data and the middle page data read from the memory cell array 31 to the sense amplifier module 39 and stored in the data latch 41. In other words, the second write operation is an operation of writing, into the respective memory cells MC in a cell unit CU, the lower bits included in the lower page data and the middle bits included in the middle page data read from the cell unit CU, and the upper bits included in the upper page data and the top bits included in the top page data input from the memory controller 10. The lower page data and the middle page data may be read from the memory cell array 31 to the memory controller 10. In this case, the page data received from the memory cell array 31 may be corrected in error by the memory controller 10 and the corrected page data may be supplied again as the lower page data and the middle page data from the memory controller 10 to the data latch 41.

Figure 8:
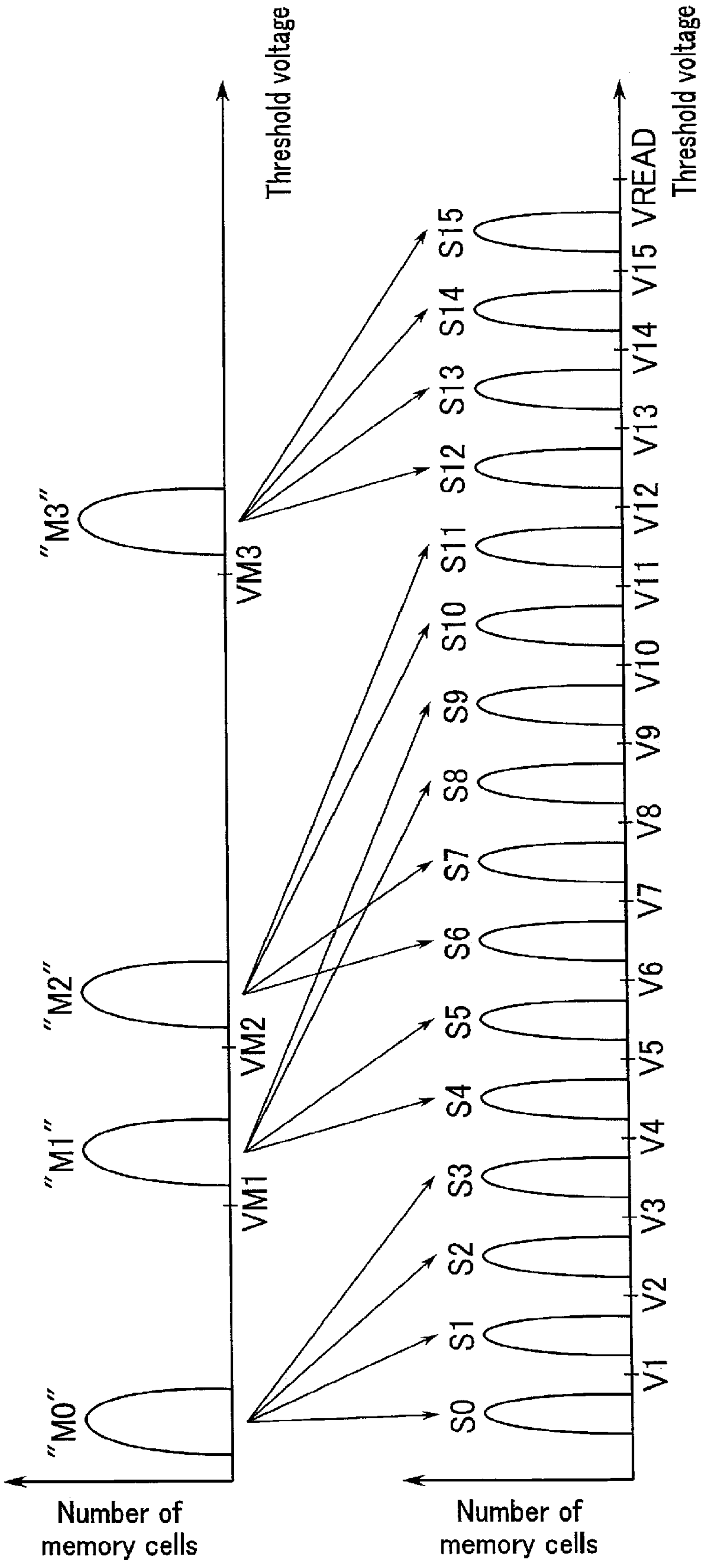
FIG. 8 is a diagram illustrating changes in threshold voltage distributions of the memory cell transistors caused by the second write operation in the memory system according to the first embodiment.

When the second write operation is executed, the threshold voltage of the memory cell MC rises based on the write data, and sixteen threshold voltage distributions are formed. FIG. 8 is a diagram illustrating changes in threshold voltage distributions of the memory cells MC caused by the second write operation. As illustrated in FIG. 8, in the second write operation, for example, the threshold voltage distributions corresponding to the "S0" state to the "S3" state are formed from the threshold voltage distribution corresponding to the "M0" state. The threshold voltage distributions corresponding to the "S4" state, the "S5" state, the "S8" state, and the "S9" state are formed from the threshold voltage distribution corresponding to the "M1" state. The threshold voltage distributions corresponding to the "S6" state, the "S7" state, the "S10" state, and the "S11" state are formed from the threshold voltage distribution corresponding to the "M2" state. The threshold voltage distributions corresponding to the "S12" state to the "S15" state are formed from the threshold voltage distribution corresponding to the "M3" state.

1-2-4 Execution Order of Data Write Operation

Figure 9:
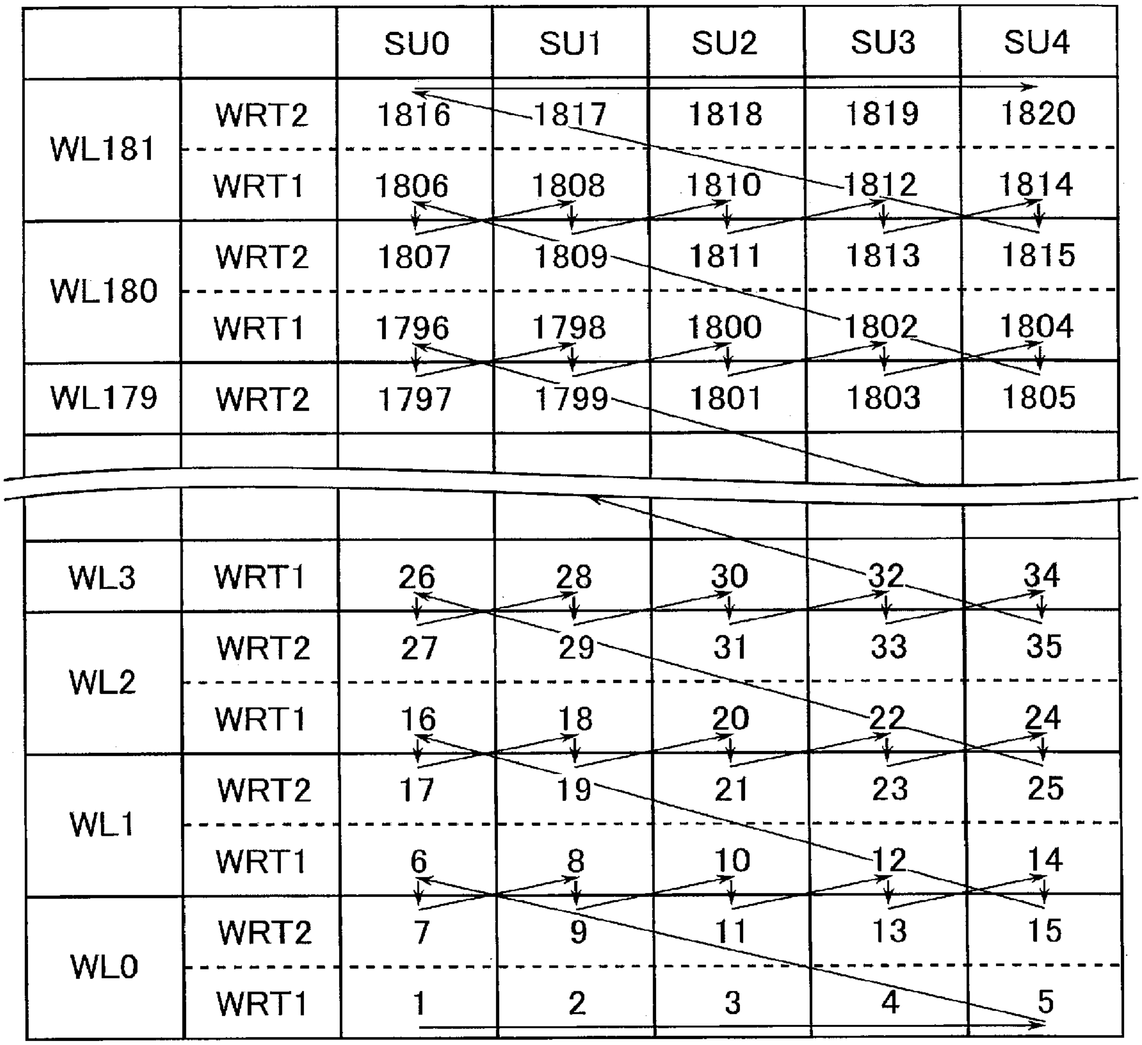
FIG. 9 is a diagram illustrating an example of the order of executing the first write operation and the second write operation in the memory system according to the first embodiment.

Next, the order of executing the first write operation and the second write operation will be described with reference to FIG. 9. FIG. 9 is a diagram illustrating an example of the order of executing the first write operation and the second write operation on a block BLK.

FIG. 9 illustrates an example of the order of selecting the word lines WL and the string units SU in the case of continuously writing data in the block BLK0. Each of square frames in a solid line, which corresponds to intersection points of the respective word lines WL and the respective string units SU, indicates a single cell unit CU. An upper stage divided by a broken line in each square frame indicates the second write operation (reference symbol "WRT2"). A lower stage divided by the broken line in each square frame indicates the first write operation (reference symbol "WRT1"). That is, the number in the upper and lower stages in the square frame indicates the order of executing the first write operation and the second write operation (hereinafter, the order will be referred to as a "write index") on the plurality of memory cells MC in each cell unit CU of the block BLK0.

As illustrated in FIG. 9, as the first to fifth operations, the sequencer 36 executes the first write operation in which the word line WL0 is selected and the string units SU0 to SU4 are selected in order.

Next, as the 6th operation, the sequencer 36 executes the first write operation in which the string unit SU0 is selected and the word line WL1 is selected. As the 7th operation, the sequencer 36 executes the second write operation in which the string unit SU0 is selected and the word line WL0 is selected.

Subsequently, as the 8th to 15th operations, the sequencer 36 selects the string units SU1 to SU4 in order, and alternately executes the first write operation in which the word line WL1 is selected and the second write operation in which the word line WL0 is selected, in the same procedure as that of the 6th and 7th operations.

Next, as the 16th to 25th operations, in a similar manner to the 6th to 15th operations, the sequencer 36 selects the string units SU0 to SU4 in order, and alternately executes the first write operation in which the word line WL2 is selected and the second write operation in which the word line WL1 is selected.

Hereinafter, in a similar manner, as the (26+10p)th to (35+10p)th operations, the sequencer 36 selects the string units SU0 to SU4 in order, and alternately executes the first write operation in which the word line WL(3+p) is selected and the second write operation in which the word line WL(2+p) is selected (p is an integer equal to or larger than 0 and equal to or smaller than 178).

Next, as the 1816th to 1820th operations, the sequencer 36 executes the second write operation in which the word line WL181 is selected and the string units SU0 to SU4 are selected in order.

1-2-5 Write Management Table

The write management table TWM will be described with reference to FIG. 10. FIG. 10 is a conceptual diagram illustrating an example of the write management table TWM.

The write management table TWM stores, for each block BLK, up to which cell unit CU the data write operation (the first write operation or the second write operation) has been executed.

As illustrated in FIG. 10, each of entries of the write management table TWM includes a write destination block BLK, a cell unit CU which is a target of a data write operation (hereinafter, referred to as a "target cell unit CU") in the write destination block BLK, and a type of the data write operation (hereinafter, referred to as a "write type") executed on the plurality of memory cells MC in the target cell unit CU. The write destination block BLK indicates a block BLK on which the data write operation is in progress, more specifically a block BLK in which writing to all of the cell units CU has not been completed and on which the data write operation may be subsequently executed. The write type stores, for example, "1" in the case where the first write operation has already been executed, and stores "2" in the case where the second write operation has already been executed.

In the example illustrated in FIG. 10, with respect to the write destination block BLK0, the data write operation has been executed up to the second write operation on the plurality of memory cells MC in the cell unit CU(1,1). With respect to the write destination block BLK1, the data write operation has been executed up to the first write operation on the plurality of memory cells MC in the cell unit CU(0,2).

The entry is added when the first write operation is executed on the plurality of memory cells MC in the cell unit CU(0,0) of a block BLK. The entry is deleted when the second write operation is executed on the plurality of memory cells MC in the cell unit CU(181,4) of the block BLK.

The write management table TWM is stored in one of the blocks BLK in the NAND flash memory 30, for example. The write management table TWM is loaded from the NAND flash memory 30 to the RAM 16, for example, immediately after the memory system 1 is powered on. Furthermore, when the memory system 1 is powered off, the write management table TWM stored in the RAM 16 is written into one of the blocks BLK in the NAND flash memory 30.

1-2-6 Write History Table

The write history table T1H will be described with reference to FIG. 11. FIG. 11 is a conceptual diagram illustrating an example of the write history table T1H.

The write history table T1H stores time when the first write operation is executed on the plurality of memory cells MC in a target cell unit CU of a write destination block BLK. The write history table T1H is prepared for each write destination block BLK.

As illustrated in FIG. 11, the write history table T1H has a plurality of (six in the example of FIG. 11) entries. Each of the entries includes an index, the target cell unit CU of the write destination block BLK, and time (hereinafter, referred to as "first write time") when the first write operation was executed on the plurality of memory cells MC in the target cell unit CU. The index is, for example, 1 to 6. The first write time stores, for example, date and time information.

In the example illustrated in FIG. 11, the time when the first write operation is executed on the plurality of memory cells MC in the cell unit CU(1,0) is 00:00:00 on Jan. 1, 2022. The time when the first write operation is executed on the plurality of memory cells MC in the cell unit CU(1,1) is 00:01:00 on Jan. 1, 2022. The time when the first write operation is executed on the plurality of memory cells MC in the cell unit CU(1,2) is 00:03:00 on Jan. 1, 2022. The time when the first write operation is executed on the plurality of memory cells MC in the cell unit CU(1,3) is 00:10:00 on Jan. 1, 2022. The time when the first write operation is executed on the plurality of memory cells MC in the cell unit CU(1,4) is 00:10:30 on Jan. 1, 2022. The time when the first write operation is executed on the plurality of memory cells MC in the cell unit CU(2,0) is 00:11:00 on Jan. 1, 2022.

Each entry is added when the first write operation is executed on a block BLK. In the case where the first write operation is executed on the block BLK when the target cell unit CU and the first write time are stored in all of the six entries of the corresponding write history table T1H, the oldest entry is updated. In the example illustrated in FIG. 11, the oldest entry is the entry of index 1. The entry is deleted when the second write operation is executed on the plurality of memory cells MC in the target cell unit CU of the block BLK.

The write history table T1H is stored in one of the blocks BLK in the NAND flash memory 30, for example. The write history table T1H is loaded from the NAND flash memory 30 to the RAM 16, for example, immediately after the memory system 1 is powered on. Furthermore, when the memory system 1 is powered off, the write history table T1H stored in the RAM 16 is written into one of the blocks BLK in the NAND flash memory 30.

The entry in the write history table T1H may not include the target cell unit CU. In this case, the cell unit CU corresponding to the first write time in each entry in the write history table T1H is determined based on the present write index and the write management table TWM.

1-2-7 Details of Data Write Operation

Next, details of a data write operation will be described with reference to FIG. 12. FIG. 12 is a flowchart illustrating an example of the data write operation.

When the memory controller 10 receives lower page data and middle page data or upper page data and top page data from the host 2, the processing from step S100 to step S105 is executed in accordance with the writing order described above.

In the case where the first write operation is to be executed on a target cell unit CU (more specifically, the plurality of memory cells MC in a target cell unit CU) (S100_Yes), the memory controller 10 sets the target cell unit CU and the first write time to the write history table T1H (S101). The memory controller 10 sets, for example, the present time as the first write time.

Upon completion of the setting to the write history table T1H, the sequencer 36 executes the first write operation on the target cell unit CU based on the lower page data and the middle page data input from the memory controller 10 to the sense amplifier module 39 (S102).

Upon completion of the first write operation on the target cell unit CU, the memory controller 10 sets the target cell unit CU and the write type to the write management table TWM (S105). The memory controller 10 sets, for example, "1" (the first write operation) as the write type. In this manner, the memory controller 10 terminates the first write operation on the target cell unit CU.

On the other hand, in the case where the first write operation is not to be executed, that is, the second write operation is to be executed on a target cell unit CU (more specifically, the plurality of memory cells MC in a target cell unit CU) (S100_No), the memory controller 10 deletes the entry of the target cell unit CU from the write history table T1H (S103).

When the entry of the target cell unit CU is deleted from the write history table T1H, the sequencer 36 executes the second write operation on the target cell unit CU based on the upper page data and the top page data input from the memory controller 10 to the sense amplifier module 39, and the lower page data and the middle page data read from the memory cell array 31 to the sense amplifier module 39 and stored in the data latch 41 (S104).

Upon completion of the second write operation on the target cell unit CU, the memory controller 10 sets the target cell unit CU and the write type to the write management table TWM (S105). The memory controller 10 sets, for example, "2" (the second write operation) as the write type. In this manner, the memory controller 10 terminates the second write operation on the target cell unit CU.

1-3 Padding Operation

It is unpredictable when a write request from the host 2 will come, and the write request may not come for a long time in the course of a data write operation. A lapse of a long period of time in the course of the data write operation on the memory cell MC may lead to deterioration in reliability of data written into the memory cell MC. In order to execute the data write operation without depending on the write request from the host 2 alone and to guarantee completion of the data write operation on the memory cell MC within a fixed time period, the present operation performs a padding operation. Hereinafter, first, an overview of the padding operation will be described.

1-3-1 Overview of Padding Operation

The padding operation is an operation of filling (writing into), with some kind of data (hereinafter, referred to as "padding data"), the plurality of memory cells MC in a cell unit CU on which the first write operation has not been executed, or the plurality of memory cells MC in a cell unit CU on which the first write operation has been executed but the second write operation has not been executed. In other words, in the padding operation, the first write operation is executed, based on the padding data, on the cell unit CU on which the first write operation has not been executed. The second write operation is executed, based on the padding data, on the cell unit CU on which the first write operation has been executed but the second write operation has not been executed. The padding operation is executed in the case where a padding determination operation results in the determination that the padding operation is to be executed.

1-3-2 Padding Determination Operation

The padding determination operation will be described with reference to FIG. 13. FIG. 13 is a flowchart illustrating an example of the padding determination operation.

The memory controller 10 executes steps S120 to S123 at fixed time intervals set in advance.

First, the memory controller 10 calculates a time difference T1 between the first write time of the oldest entry in the write history table T1H and the present time (S120). That is, the memory controller 10 calculates an elapsed time period T1 after the execution of the first write operation on the plurality of memory cells MC in a cell unit CU on which the oldest first write operation was executed.

In the case where the time difference T1 does not exceed a threshold value TVa (S121_No), the memory controller 10 terminates the padding determination operation. In this case, the memory controller 10 does not execute the padding operation. The threshold value TVa is, for example, one hour, two hours, etc.

On the other hand, in the case where the time difference T1 exceeds the threshold value TVa (S121_Yes), the memory controller 10 determines that the padding operation is to be executed, and prepares padding data (S122). Specifically, the memory controller 10 prepares, based on the write management table TWM and the write history table T1H, the padding data for use in data write operations scheduled to be executed from (A) a data write operation next to the present write index to (B) the second write operation on the target cell unit CU of the oldest entry. In this case, the memory controller 10 executes the padding operation based on the prepared padding data (S123). The padding operation will be described later in detail.

1-3-3 Padding Data

The size of the padding data to be prepared will be described.

First, a case in which a target cell unit CU and the first write time are stored for all of the six entries in the write history table T1H will be described with reference to FIG. 14. FIG. 14 is a diagram illustrating an example of a size of padding data for use in the padding operation.

FIG. 14 describes, as an example, a case in which a data write operation has been executed up to the first write operation on the cell unit CU(2,1) (write index: 18). In this case, as illustrated in FIG. 14, the write management table TWM stores "CU(2,1)" as the target cell unit CU of the corresponding write destination block BLK and stores "1" as the write type. In indexes 1 to 6 of the write history table T1H, "CU(2,1)", "CU(1,1)", "CU(1, 2)", "CU(1, 3)", "CU (1, 4)", and "CU(2, 0)" are stored as the target cell unit CU in order from index 1, and the time when the first write operation was executed on the corresponding cell unit CU is stored as the first write time in each of these indexes. The oldest entry in the write history table T1H is the entry of index 2.

The data write operation to be executed next to the first write operation on the cell unit CU(2,1) is the second write operation on the cell unit CU(1,1) (write index: 19). The oldest entry in the write history table T1H is the entry of the cell unit CU(1,1). In this case, the target cell unit CU on which the padding operation is to be executed is the cell unit CU(1,1). Thus, in the case where the target cell unit CU and the first write time are stored in all of the six entries in the write history table T1H, the memory controller 10 prepares the padding data (upper page data and top page data) for use in the second write operation on the target cell unit CU (cell unit CU(1,1)) of the oldest entry. That is, the size of the padding data prepared in this case is 2-page data.

Next, a case in which the write history table T1H contains an entry in which the target cell unit CU and the first write time are not stored will be described with reference to FIG. 15. FIG. 15 is a diagram illustrating an example of a size of padding data for use in the padding operation.

FIG. 15 describes, as an example, a case in which a data write operation has been executed up to the first write operation on the cell unit CU(0,2) (write index: 3). In this case, as illustrated in FIG. 15, the write management table TWM stores "CU(0, 2)" as the target cell unit CU of the corresponding write destination block BLK and stores "1" as the write type. In indexes 1 to 3 of the write history table T1H, "CU(0, 0)", "CU(0, 1)", and "CU(0, 2)" are stored as the target cell unit CU in order from index 1, and the time when the first write operation was executed on the corresponding cell unit CU is stored as the first write time in each of these indexes. In indexes 4 to 6, the target cell unit CU and the first write time are not stored. The oldest entry in the write history table T1H is the entry of index 1.

The data write operation to be executed next to the first write operation on the cell unit CU(0,2) is the first write operation on the cell unit CU(0,3) (write index: 4). The oldest entry in the write history table T1H is the entry of the cell unit CU(0,0). In this case, the target cell unit CU on which the padding operation is to be executed is the cell unit CU(0,3), the cell unit CU(0,4), the cell unit CU(1,0), and the cell unit CU(0,0). Thus, in the case where the write history table T1H contains an entry in which the target cell unit CU and the first write time are not stored, the memory controller 10 prepares the padding data (lower page data and middle page data) for use in the first write operation on the cell unit CU(0,3), the cell unit CU(0,4), and the cell unit CU(1,0). Furthermore, the memory controller 10 prepares the padding data (upper page data and top page data) for use in the second write operation on the target cell unit CU(cell unit CU(0,0)) of the oldest entry. That is, the size of the padding data prepared in this case is 2 pages×4 cell units CU=8-page data.

Next, the content of padding data to be prepared will be described.

The padding data is, for example, dummy data. The dummy data is data prepared by, for example, randomizing "0" data having the number of bits of data to be prepared, in such a manner as to prevent an imbalance between the number of 0's and the number of 1's. The randomizing is executed by, for example, the memory controller 10. The dummy data may be, for example, random data having the number of bits of data to be prepared.

Furthermore, the padding data may be, for example, data of another block BLK. Data of said another block BLK is, for example, data to be rewritten (copied) from said another block BLK by wear leveling, compaction, or refresh.

Note that the wear leveling, compaction, and refresh are executed by the memory controller 10.

The wear leveling is, for example, processing of leveling the number of data erase operations between the plurality of blocks in the NAND flash memory 30 by exchanging data stored in a block BLK passing through a relatively large number of data erase operations and data stored in another block BLK passing through a relatively small number of data erase operations.

The compaction is processing of reading (collecting) valid data from a plurality of blocks and rewriting the valid data in another block BLK. The compaction is performed, for example, in the case where the number of erasable blocks BLK decreases.

The refresh is processing of correcting an error in data stored in a block BLK and then rewriting the corrected data in another block BLK or the block BLK itself. The refresh is executed, for example, when the block BLK with an increased number of corrected bits is detected through the error correction processing or when a fixed time period has elapsed from the execution of a data write operation on the block BLK.

1-3-4 Details of Padding Operation

Next, details of the padding operation will be described with reference to FIG. 16. FIG. 16 is a flowchart illustrating an example of the padding operation.

The padding operation is executed based on the elapsed time period T1 after the execution of the first write operation on the cell unit CU on which the oldest first write operation was executed. In the case of the elapsed time period T1 exceeding the threshold value TVa, that is, when the memory controller 10 prepares the padding data through the processing at step S122 illustrated in FIG. 13 described above, the processing from step S130 to step S136 is executed in accordance with the write order described above. In other words, corresponding 2-page data of the prepared padding data is written in accordance with the write order into the plurality of memory cells MC in a target cell unit CU on which the padding operation is to be executed.

In the case where the first write operation is to be executed on the target cell unit CU(more specifically, the plurality of memory cells MC in the target cell unit CU) (S130_Yes), in the case of the padding data being the dummy data (S131_Yes), the sequencer 36 executes the first write operation on the target cell unit CU based on the prepared padding data (lower page data and middle page data corresponding to the target cell unit CU) input from the memory controller 10 to the sense amplifier module 39 (S133). In other words, the sequencer 36 writes the padding data into the target cell unit CU by executing the first write operation. On the other hand, in the case of the padding data not being the dummy data (S131_No), the memory controller 10 sets the target cell unit CU and the first write time to the write history table T1H (S132). Data that is not the dummy data is, for example, data that is rewritten from another block through wear leveling, compaction, or refresh. Upon completion of the setting to the write history table T1H, the sequencer 36 executes the processing at step S133.

Upon completion of the first write operation on the target cell unit CU, the memory controller 10 sets the target cell unit CU and the write type to the write management table TWM (S136). The memory controller 10 sets, for example, "1" (the first write operation) as the write type.

On the other hand, in the case where the second write operation is to be executed on the target cell unit CU(more specifically, the plurality of memory cells MC in the target cell unit CU) (S130_No), the memory controller 10 deletes the entry of the target cell unit CU from the write history table T1H (S134).

When the entry of the target cell unit CU is deleted from the write history table T1H, the sequencer 36 executes the second write operation on the target cell unit CU based on the prepared padding data (upper page data and top page data corresponding to the target cell unit CU) input from the memory controller 10 to the sense amplifier module 39 (S135). In other words, the sequencer 36 writes the padding data into the target cell unit CU by executing the second write operation.

Upon completion of the second write operation on the target cell unit CU, the memory controller 10 sets the target cell unit CU and the write type to the write management table TWM (S136). The memory controller 10 sets, for example, "2" (the second write operation) as the write type.

Through the padding operation, the first write operation is executed on the cell units CU respectively corresponding to the write indexes using the padding data (lower page data and middle page data) from the next write index of the present write index to a write index that is one value smaller than the write index of the second write operation of the cell unit CU on which the oldest first write operation was executed. In other words, in the first write operation, the memory controller 10 causes the sequencer 36 to execute the writing of the padding data (lower page data and middle page data) into these cell units CU. Furthermore, the second write operation on the cell unit CU on which the oldest first write operation was executed is executed using the padding data (upper page data and top page data). In other words, in the second write operation, the memory controller 10 causes the sequencer 36 to execute writing of the padding data (upper page data and top page data) into the cell unit CU on which the oldest first write operation was executed. In this manner, the padding data is written into the cell units CU respectively corresponding to the write indexes from the next write index of the present write index to the write index of the second write operation of the cell unit CU on which the oldest first write operation was executed.

Note that after the memory system 1 is powered off, the memory controller 10 prepares the padding data when the memory system 1 is powered on again. Specifically, for example, the memory controller 10 prepares, based on the write management table TWM and the write history table T1H, the padding data for use in the respective data write operations from a data write operation to be executed next to the present write index to the second write operation on the target cell units CU of all entries in the write history table T1H. The memory controller 10 executes the padding operation based on the prepared padding data.

1-4 Effects

The first embodiment can improve data reliability of the memory system 1. The effects will be described below.

In the case of writing data in the block BLK in the write order illustrated in FIG. 9 based on a write request received from the host 2, the first write operation and the second write operation are not continuously executed in each target cell unit CU. In the example illustrated in FIG. 9, the number of steps from the execution of the first write operation to the execution of the second write operation is 6 to 10 steps in the string units SU0 to SU4 of the word lines WL0 and WL181, and is 11 steps in the string units SU0 to SU4 of the other word lines WL.

Thus, depending on the target cell unit CU, the second write operation may not be executed for a while after the execution of the first write operation on the memory cell MC, and the memory cell MC may be left for a relatively long time after the execution of the first write operation thereon. This is, for example, the case where a write request received from the host 2 is intermittent or where power is shut down and is not supplied for a while in the course of a data write operation being executed based on a write request received from the host 2. In this case, for example, electrons may come out of the charge storage layer of the memory cell MC, and the threshold voltage may change, thereby causing a bit error.

In the present embodiment, the memory controller 10 executes the padding determination operation at fixed time intervals set in advance. In the padding determination operation, in the case where the elapsed time period from the execution of the first write operation on the target cell unit CU of the oldest entry in the write history table T1H exceeds the threshold value, the memory controller 10 prepares padding data based on the write management table TWM and the write history table T1H. The padding data to be prepared is data used for each of data write operations scheduled to be executed from (A) a data write operation next to the present write index to (B) the second write operation on the target cell unit CU of the oldest entry. When the padding data is prepared, the memory controller 10 executes the padding operation based on the prepared padding data. In this manner, the padding data is written into the plurality of memory cells MC in each of the target cell units CU, from the target cell unit CU for a data write operation to be executed next to the present write index, to the target cell unit CU of the oldest entry.

Therefore, the configuration according to the present embodiment can prevent the memory cell MC from being left for a relatively long time after the execution of the first write operation thereon. This can reduce the possibility of a bit error occurring after the execution of the first write operation. Thus, data reliability of the memory system 1 can be improved.

2. Second Embodiment

A second embodiment will be described. The memory system 1 according to the present embodiment differs from that of the first embodiment in terms of the write history table T1H being eliminated. In addition, the memory system 1 according to the present embodiment differs from that of the first embodiment in terms of the configuration of the NAND flash memory 30. Furthermore, the memory system 1 according to the present embodiment differs from that of the first embodiment in terms of a data write operation. Hereinafter, the following description will in principle focus on the features different from the first embodiment.

2-1 Configuration of Memory System

Figure 17:
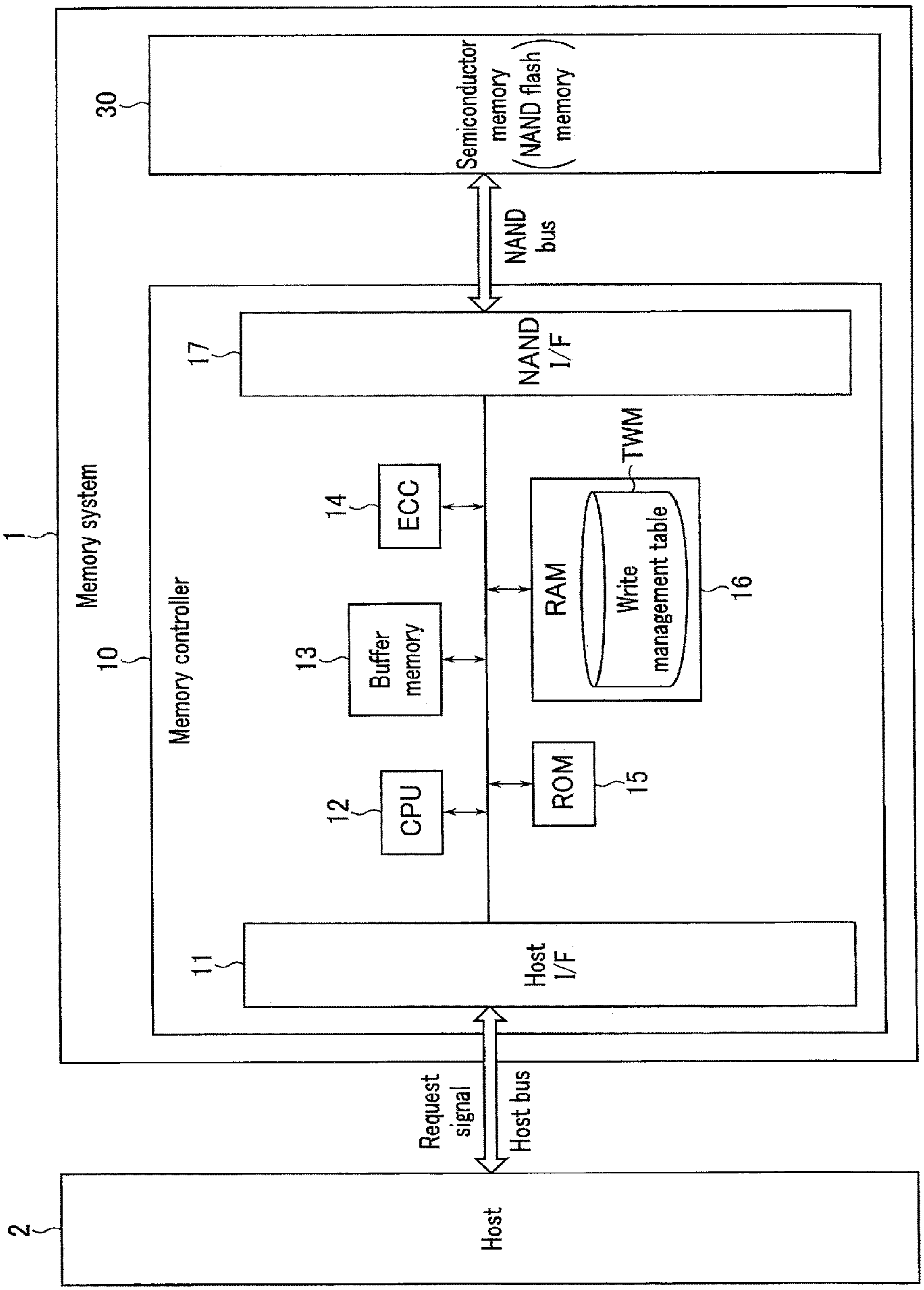
FIG. 17 is a block diagram illustrating an example of an information processing system including a memory system according to a second embodiment.

The configuration of the memory system 1 will be described with reference to FIG. 17. FIG. 17 is a block diagram illustrating an example of the information processing system including the memory system 1.

In the memory system 1, the write history table T1H is eliminated. The rest of the configuration of the memory system 1 is similar to that of the first embodiment described with reference to FIG. 1.

2-2 Configuration of NAND Flash Memory

Figure 18:
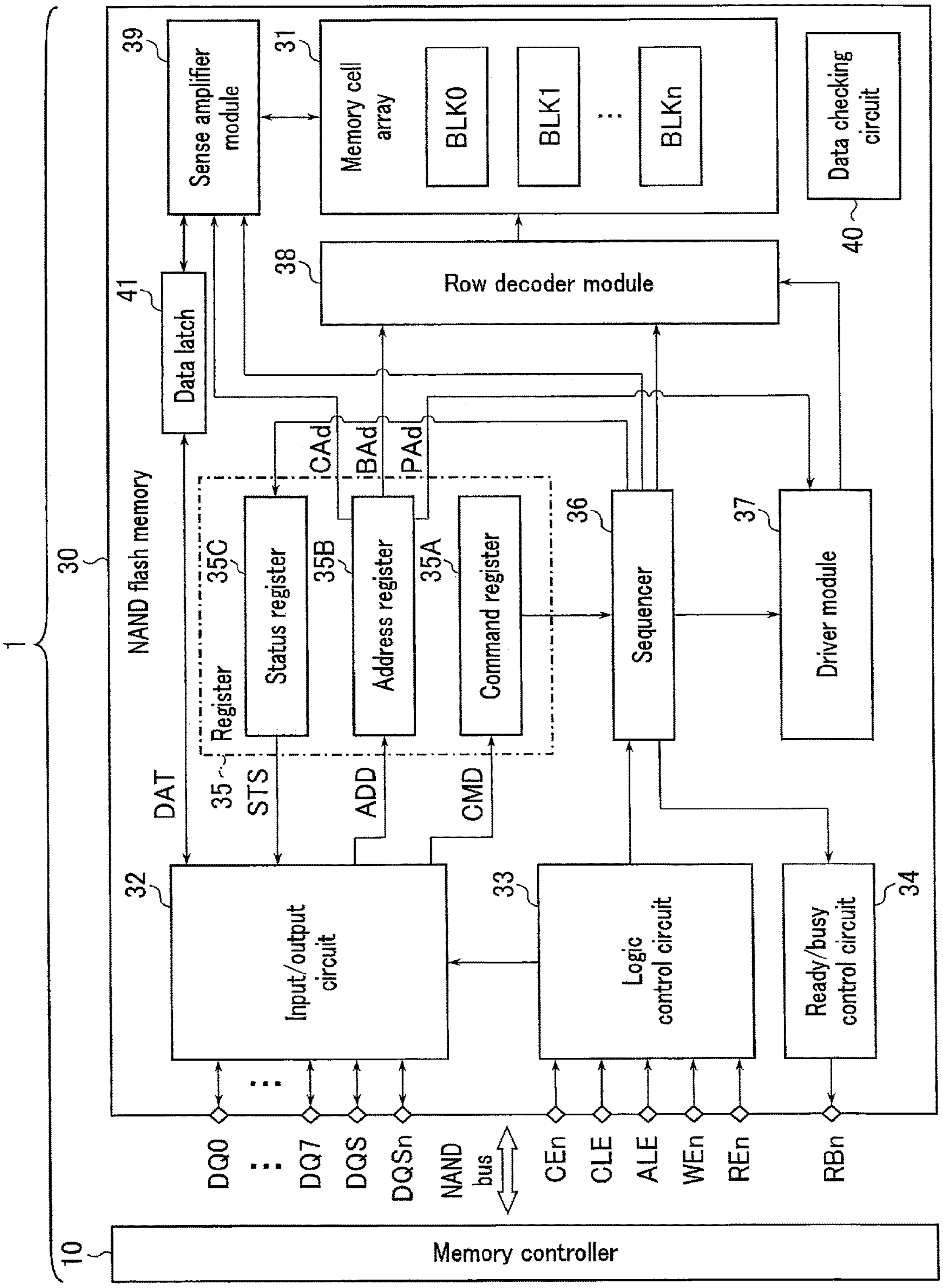
FIG. 18 is a block diagram illustrating an example of the configuration of a semiconductor memory included in the memory system according to the second embodiment.

The configuration of the NAND flash memory 30 will be described with reference to FIG. 18. FIG. 18 is a block diagram illustrating an example of the configuration of the NAND flash memory 30.

The NAND flash memory 30 further includes a data checking circuit 40.

The data checking circuit 40 is a circuit configured to check whether or not the lower bit and the middle bit stored in the memory cell MC on which the first write operation has been executed have a bit error.

The data checking circuit 40 detects a bit error of data stored in the memory cell MC using an error detection code (EDC), for example. That is, checking data by the data checking circuit 40, for example, detects the number of error bits in the lower bit and the middle bit for each cell unit CU by using the error detection code. Specifically, the sequencer 36 reads, by using the read voltages VM1, VM2, and VM3, the lower page data and the middle page data from the cell unit CU on which the first write operation has been executed. Each of the read voltages VM1, VM2, and VM3 is a voltage Vdt for use in verifying the lower page data and the middle page data from the memory cell array 31 in the second write operation. The read data is supplied to the data checking circuit 40. Upon receipt of the data, the data checking circuit 40 detects the number of error bits in the read data in a predetermined unit using the error detection code. The error detection code is, for example, a parity code, a check sum, a cyclic redundancy code (CRC), etc. Upon completion of the checking of the data, the data checking circuit 40 transmits a check result (detection value) to the memory controller 10.

The rest of the configuration of the NAND flash memory 30 is similar to that of the first embodiment described with reference to FIG. 2.

The data checking circuit 40 may be provided in the memory controller 10.

2-3 Data Write Operation

In the present embodiment, the data write operation includes a recovery operation. The recovery operation is an operation of correcting data of the memory cell MC for which it is determined that a bit error is present after the execution of the first write operation thereon. The recovery operation is executed based on a check result by the data checking circuit 40. The recovery operation will be described later in detail.

The data write operation will be described with reference to FIG. 19. FIG. 19 is a flowchart illustrating an example of the data write operation.

When the memory controller 10 receives the lower page data and the middle page data or the upper page data and the top page data from the host 2, the processing from step S200 to step S206 is executed in accordance with the write order described in the first embodiment.

In the case where the first write operation is to be executed on the target cell unit CU(more specifically, the plurality of memory cells MC in the target cell unit CU) (S200_No), the sequencer 36 executes the first write operation on the target cell unit CU based on the lower page data and the middle page data input from the memory controller 10 to the sense amplifier module 39 (S205).

Upon completion of the first write operation to the target cell unit CU, the memory controller 10 sets the target cell unit CU and the write type to the write management table TWM (S206). The memory controller 10 sets, for example, "1" (the first write operation) as the write type.

On the other hand, in the case where the second write operation is to be executed on the target cell unit CU(more specifically, the plurality of memory cells MC in the target cell unit CU) (S200_Yes), the sequencer 36 reads, by using the read voltages VM1, VM2, and VM3, the lower page data and the middle page data from the target cell unit CU. The read data is stored in the data latch 41 and is also supplied to the data checking circuit 40. The data checking circuit 40 checks the lower page data and the middle page data of the target cell unit CU(S201). Upon completion of the checking of the data, the data checking circuit 40 transmits a check result with respect to the target cell unit CU to the memory controller 10.

Upon receipt of the check result from the data checking circuit 40, the memory controller 10 determines whether or not the check result (that is, the number of error bits detected by the data checking circuit 40) exceeds the threshold value TVb (S202). The threshold value TVb is, for example, equal to or larger than 1 bit and equal to or smaller than the number of error bits detectable by the data checking circuit 40. The threshold value TVb is, for example, several bits, several tens of bits, etc.

In the case of the check result not exceeding the threshold value TVb (S202_No), the sequencer 36 executes the second write operation on the target cell unit CU based on the upper page data and the top page data input from the memory controller 10 to the sense amplifier module 39, and the lower page data and the middle page data stored in the data latch 41 (S204).

Upon completion of the second write operation to the target cell unit CU, the memory controller 10 sets the target cell unit CU and the write type to the write management table TWM (S206). The memory controller 10 sets, for example, "2" (the second write operation) as the write type.

On the other hand, in the case of the check result exceeding the threshold value TVb (S202_Yes), that is, in the case of determination that the lower bits or the middle bits have more bit errors than the threshold value TVb, the memory controller 10 executes the recovery operation (S203).

2-4 Recovery Operation

The recovery operation will be described with reference to FIG. 20. FIG. 20 is a flowchart illustrating an example of the recovery operation.

Through the processing at step S202 illustrated in FIG. 19 described above, when the memory controller 10 determines that the check result exceeds the threshold value TVb, the processing from step S210 to step S220 is executed.

The memory controller 10 instructs output of the lower page data and the middle page data of the target cell unit CU stored in the data latch 41 through the processing at step S201 (S210). The memory controller 10 then executes the ECC processing on the received data (S210).

In the case where the correction of the read data is successful through the processing at step S210 (S211_Yes), the lower page data and the middle page data corrected through the processing at step S210 are supplied to the NAND flash memory 30. When the NAND flash memory 30 receives the data, the sequencer 36 executes the second write operation on the target cell unit CU based on the upper page data and the top page data input from the memory controller 10 to the sense amplifier module 39, and the lower page data and the middle page data corrected through the processing at step S210 (S214). In other words, in the second write operation, the memory controller 10 causes the sequencer 36 to perform writing the lower bit and the middle bit corrected through the processing at step S210, and the upper bit and the top bit. That is, the writing is executed in such a manner that a memory cell MC storing two bits (the lower and middle bits before correction) through the first write operation stores data of four bits in total including the corrected lower and middle bits and the upper and top bits.

Upon completion of the second write operation on the target cell unit CU, the memory controller 10 sets the target cell unit CU and the write type to the write management table TWM (S215). The memory controller 10 sets, for example, "2" (the second write operation) as the write type.

On the other hand, in the case where the correction of the read data is not successful through the processing at step S210 (S211_No), the memory controller 10 reads the lower page data and the middle page data from the target cell unit CU using voltages VM1s, VM2s, and VM3s (hereinafter, also referred to as "shifted voltages Vst") respectively shifted from the voltages VM1, VM2, and VM3 (S212). The memory controller 10 then executes the ECC processing on the read data (S212). The amount of shift in voltage (hereinafter, referred to as a "shift amount ΔV") may be different for each of the read voltages, may be the same between some of the read voltages, or may be the same between all of the read voltages. Furthermore, the shift amount ΔV may be either a negative value or a positive value. The shift amount ΔV is set to an appropriate value by, for example, the memory controller 10.

In the case where the correction of the read data is successful through the processing at step S212 (S213_Yes), the lower page data and the middle page data corrected through the processing at step S212 are supplied to the NAND flash memory 30. when the NAND flash memory 30 receives the data, the sequencer 36 executes the second write operation on the target cell unit CU based on the upper page data and the top page data input from the memory controller 10 to the sense amplifier module 39, and the lower page data and the middle page data corrected through the processing at step S212 (S214).

In the case where the correction of the read data is not successful through the processing at step S212 (S213_No), it is assumed that the data of the target cell unit CU has a relatively large number of error bits. In other words, in the plurality of memory cells MC in the target cell unit CU, there may be an overlap in threshold voltage distributions between the "M0" state and the "M1" state, the "M1" state and the "M2" state, or the "M2" state and the "M3" state. When two threshold voltage distributions overlap each other, an intersection of these threshold voltage distributions indicates a position at which the number of error bits is small. To search for the intersection, the memory controller 10 executes, for example, tracking. The tracking is for searching for the intersection (voltage) on which two threshold voltage distributions (that is, threshold voltage distributions of the "M0" and "M1" states, the "M1" and "M2" states, or the "M2" and "M3" states) of the memory cells MC overlap each other. Specifically, the memory controller 10 reads, by using read voltages VM1t, VM2t, and VM3t obtained through the tracking, the lower page data and the middle page data from the target cell unit CU(S216). The memory controller 10 then executes the ECC processing on the read data (S216).

When the read data is corrected through the processing at step S216, the memory controller 10 prepares padding data (the upper page data and the top page data) for use in the second write operation on the target cell unit CU, as with the first embodiment (S217).

When the padding data is prepared, the sequencer 36 executes the second write operation on the target cell unit CU based on the padding data (the upper page data and the top page data) input from the memory controller 10 to the sense amplifier module 39 (S218). That is, in the case where the lower page data or the middle page data of the target cell unit CU have a relatively large number of error bits (for example, more than 100 error bits), the padding data, not the upper page data and the top page data, which are both to be written, is written into the target cell unit CU through the second write operation.

The lower page data and the middle page data corrected through the processing at step S216 are supplied to the NAND flash memory 30. When the NAND flash memory 30 receives the data, the sequencer 36 writes the lower page data and the middle page data corrected through the processing at step S216 into a cell unit CU (hereinafter, referred to as a "cell unit CUa") different from the target cell unit CU, more specifically, a plurality of memory cells in the cell unit CUa (S219).

The sequencer 36 may write the corrected lower page data and middle page data into the cell unit CUa, as its lower page data and middle page data.

The cell unit CUa may be a cell unit CU corresponding to the next write index of the present write index. For example, in the case of the target cell unit CU being the cell unit CU(1, 1) described with reference to FIG. 14, that is, the cell unit corresponding to the write index of 19, the sequencer 36 may select the cell unit CU(2, 2) corresponding to the write index of 20 as the cell unit CUa. The sequencer 36 writes the corrected lower page data and middle page data into the cell unit CU(2,2) as its lower page data and middle page data.

The cell unit CUa may be a cell unit CU corresponding to a write index of a relatively large value as compared to the present write index. For example, in the case of the target cell unit CU being the cell unit CU(1,1) described with reference to FIG. 14, that is, the cell unit corresponding to the write index of 19, the sequencer 36 may select the cell unit CU(2,4) corresponding to the write index of 24 as the cell unit CUa. The sequencer 36 writes the corrected lower page data and middle page data into the cell unit CU(2,4) as its lower page data and middle page data.

Alternatively, the sequencer 36 may write the corrected lower page data and middle page data into the cell unit CUa, as its upper page data and top page data. In this case also, the cell unit CUa may be a cell unit CU corresponding to the next write index of the present write index or may be a cell unit CU corresponding to a write index of a relatively large value as compared to the present write index.

For example, in the case of the target cell unit CU being the cell unit CU(1,1) described with reference to FIG. 14, that is, the cell unit corresponding to the write index of 19, the sequencer 36 may select the cell unit CU(1,2) corresponding to the write index of 21 as the cell unit CUa. The sequencer 36 writes the corrected lower page data and middle page data into the cell unit CU(1,2) as its upper page data and top page data. Alternatively, the sequencer 36 may select the cell unit CU(1,4) corresponding to the write index of 25 as the cell unit CUa. The sequencer 36 writes the corrected lower page data and middle page data into the cell unit CU(1,4) as its upper page data and top page data.

Upon completion of writing into the cell unit CUa, the sequencer 36 writes the upper page data and the top page data input from the memory controller 10 to the sense amplifier module 39 into a cell unit CU(hereinafter, referred to as a "cell unit CUb") different from the target cell unit CU, more specifically, the plurality of memory cells in the cell unit CUb (S220).

The sequencer 36 may write the upper page data and top page data, which are both to be written, into the cell unit CUb, as its upper page data and top page data.

The cell unit CUb may be a cell unit CU corresponding to the next write index of the present write index. For example, in the case of the target cell unit CU being the cell unit CU(1, 1) described with reference to FIG. 14, that is, the cell unit corresponding to the write index of 19, the sequencer 36 may select the cell unit CU(1, 2) corresponding to the write index of 21 as the cell unit CUb. The sequencer 36 writes the upper page data and the top page data, which are both to be written, into the cell unit CU(1,2), as its upper page data and top page data.

The cell unit CUb may be a cell unit CU corresponding to a write index of a relatively large value as compared to the present write index. For example, in the case of the target cell unit CU being the cell unit CU(1,1) described with reference to FIG. 14, that is, the cell unit corresponding to the write index of 19, the sequencer 36 may select the cell unit CU(1,4) corresponding to the write index of 25 as the cell unit CUb. The sequencer 36 writes the upper page data and the top page data, which are both to be written, into the cell unit CU(1,4), as its upper page data and top page data.

Alternatively, the sequencer 36 may write the upper page data and the top page data, which are both to be written, into the cell unit CUb, as its lower page data and middle page data. In this case also, the cell unit CUb may be a cell unit CU corresponding to the next write index of the present write index or may be a cell unit CU corresponding to a write index of a relatively large value as compared to the present write index.

For example, in the case of the target cell unit CU being the cell unit CU(1,1) described with reference to FIG. 14, that is, the cell unit corresponding to the write index of 19, the sequencer 36 may select the cell unit CU(2,2) corresponding to the write index of 20 as the cell unit CUb. The sequencer 36 writes the upper page data and the top page data, which are both to be written, into the cell unit CU(2,2), as its lower page data and middle page data. Alternatively, the sequencer 36 may select the cell unit CU(2, 4) corresponding to the write index of 24 as the cell unit CUb. The sequencer 36 writes the upper page data and the top page data, which are both to be written, into the cell unit CU(2,4), as its lower page data and middle page data.

The cell unit CUb may be the same as or different from the cell unit CUa.

2-5 Effects

As described in the first embodiment, when the memory cell MC is left for a relatively long time after the first write operation is executed thereon, a bit error in data stored in the memory cell MC may occur.

In the present embodiment, at the time of execution of the second write operation, the data checking circuit 40 executes checking on the lower page data and the middle page data of the target cell unit CU on which the first write operation has been executed. In the case of determination that the check result exceeds the threshold value TVb, the memory controller 10 executes the recovery operation.

In the recovery operation, in the case of a relatively small number of error bits, the memory controller 10 corrects the lower page data and the middle page data of the target cell unit CU. The case of the relatively small number of error bits is, for example, a case in which the lower page data and middle page data of the target cell unit CU read by using, for example, a plurality of default read voltages Vdt are corrected, or a case in which the lower page data and the middle page data of the target cell unit CU read by using a plurality of shifted voltages Vst are corrected. Upon the correction of the data, the sequencer 36 executes the second write operation on the target cell unit CU based on the upper page data and top page data input from the memory controller 10 to the sense amplifier module 39, and the corrected lower page data and middle page data.

In the recovery operation, in the case of a relatively large number of error bits, the memory controller 10 corrects the lower page data and the middle page data of the target cell unit CU. The case of the relatively large number of error bits is, for example, a case in which the lower page data and the middle page data of the target cell unit CU read by using a plurality of read voltages obtained through tracking are corrected. Upon the correction of the data, the corrected lower page data and middle page data are written into a cell unit CUa different from the target cell unit CU. The upper page data and the top page data input from the memory controller 10 to the sense amplifier module 39 are also written into a cell unit CUb different from the target cell unit CU. Herein, the cell units CUa and CUb may be the same or different. On the other hand, the padding data is written into the target cell unit CU. That is, the target cell unit CU does not serve as a target of a data read operation until the execution of a next data erase operation and data write operation.

This can reduce the possibility that a bit error will occur. Thus, the configuration according to the present embodiment can improve data reliability of the memory system 1.

2-6 First Modification

A memory system according to a first modification of the second embodiment will be described. The memory system 1 according to the present modification differs from that of the second embodiment in terms of the configuration of the data checking circuit 40. The present modification is based on the precondition that data randomized to prevent an imbalance between the number of 0's and the number of 1's of 1-page data is written into a cell unit CU. Hereinafter, the following description will in principle focus on the features different from the second embodiment.

2-6-1 Data Checking Circuit

The data checking circuit 40 in the present modification counts the number of memory cells MC belonging to each of the four states (the "M0" state to the "M3" state) of the threshold voltage distributions formed by the first write operation, for example. That is, in a cell unit CU, the data checking circuit 40 counts the number of bits of the "0" data or "1" data of the lower bits and middle bits. Specifically, the sequencer 36 acquires, by using one of the read voltages VM1, VM2, and VM3, states of the plurality of memory cells MC in the cell unit CU on which the first write operation has been executed. The acquired states of the memory cells MC are supplied to the data checking circuit 40. Upon receipt of the states of memory cells MC, the data checking circuit 40 counts the number of memory cells MC which are turned on. In other words, in the case where the states of memory cells MC in the cell unit CU on which the first write operation has been executed are acquired using the read voltage VM1, the data checking circuit 40 counts the number of memory cells MC having a threshold voltage equal to or lower than the voltage VM1. Similarly, in the case where the states of memory cells MC are acquired using the read voltage VM2, the data checking circuit 40 counts the number of memory cells MC having a threshold voltage equal to or lower than the voltage VM2. Similarly, in the case where the states of memory cells MC are acquired using the read voltage VM3, the data checking circuit 40 counts the number of memory cells MC having a threshold voltage equal to or lower than the voltage VM3. Upon completion of counting the number of memory cells MC, the data checking circuit 40 transmits a check result (counted value) to the memory controller 10.

The threshold value TVb for use in the processing at step S202 will be described.

Upon receipt of the check result from the data checking circuit 40 at step S202, the memory controller 10 determines whether or not the check result (the counted value) exceeds the threshold value TVb.

For example, in the case where 2-page data including the lower page data and the middle page data has a size of 32 Kbytes (KB), that is, the number of memory cells MC included in the cell unit CU is expressed as 16K×8 and randomized data is written into a cell unit CU, an expected value for the number of memory cells having a threshold voltage corresponding to each of the "M0" state to the "M3" state included in the cell unit CU is expressed as 4K×8. In other words, in the case where data is read using the voltage VM1 with respect to the target cell unit CU on which the first write operation has been executed, the expected value for the number of memory cells MC having a threshold voltage corresponding to the "M0" state is expressed as 4K×8. Similarly, in the case where data is read using the voltage VM2, the expected value for the number of memory cells MC having a threshold voltage corresponding to the "M0" state or the "M1" state is expressed as 4K×8+4K×8=8K×8. In the case where data is read using the voltage VM3, the expected value for the number of memory cells MC having a threshold voltage corresponding to the "M0" state, the "M1" state, or the "M2" state is expressed as 4K×8+4K×8+4K×8=12K×8.

The threshold value TVb is set within a range from, for example, a value smaller than the expected value to a value larger than the expected value, in consideration of the accuracy of randomization. The threshold value TVb falls within, for example, a range between the expected value−100 and the expected value+100. In this case, in the processing at step S202, the memory controller 10 determines whether or not the check result (the number of memory cells MC counted by the data checking circuit 40) falls within a range between the expected value−100 and the expected value+100. In the case where the check result falls within the aforementioned range (S202_No), the controller 10 executes the second write operation on the target cell unit CU (S204). On the other hand, in the case where the check result does not fall within the aforementioned range (S202_Yes), the memory controller 10 executes the recovery operation (S203).

2-6-2 Recovery Operation

Figure 21:
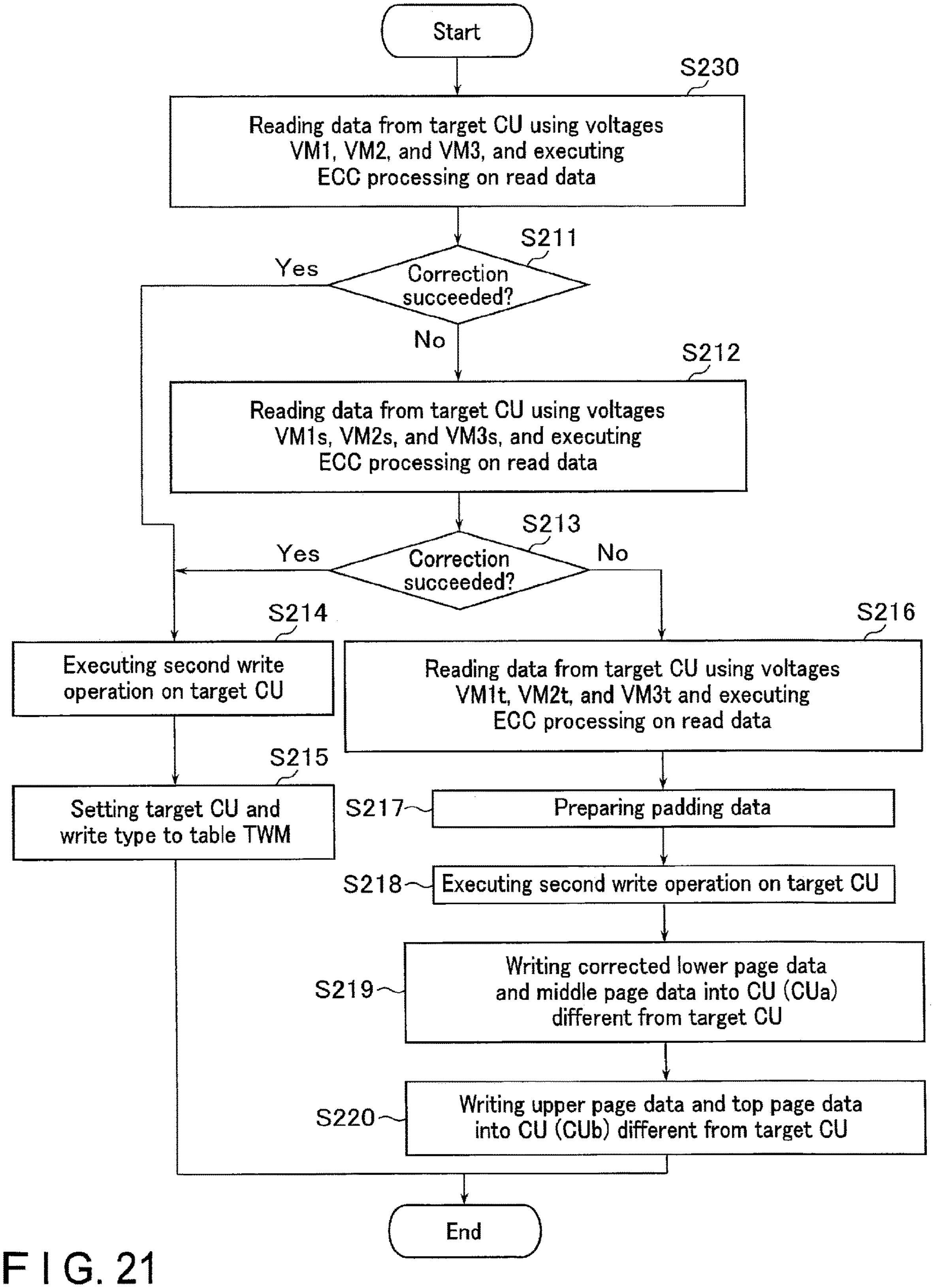
FIG. 21 is a flowchart illustrating an example of a recovery operation in a memory system according to a first modification of the second embodiment.

The recovery operation will be described with reference to FIG. 21. FIG. 21 is a flowchart illustrating an example of the recovery operation.

Through the processing at step S202 illustrated in FIG. 19 described above, when the memory controller 10 determines that the check result exceeds the threshold value TVb, the processing at step S230 and steps 211 to 220 is executed.

The memory controller 10 reads the lower page data and the middle page data from the target cell unit CU using the read voltages VM1, VM2, and VM3 (S230). The memory controller 10 then executes the ECC processing on the read data (S230).

The processing from step S211 to step S220 other than step S230 is similar to that of the second embodiment described with reference to FIG. 20.

2-6-3 Effects

The present modification produces effects similar to those of the second embodiment. Further, the data checking circuit 40 according to the present modification may be implemented by a smaller circuit than the data checking circuit 40 according to the second embodiment.

2-7 Second Modification

A memory system according to a second modification of the second embodiment will be described. The memory system 1 according to the present modification differs from that of the second embodiment in terms of a data write operation. Hereinafter, the following description will in principle focus on the features different from the second embodiment.

2-7-1 Data Write Operation

In the present modification, the data write operation includes a data checking determination operation. The data checking determination operation is an operation of determining whether to execute checking on the lower page data and the middle page data of a target cell unit CU by the data checking circuit 40.

Figure 22:
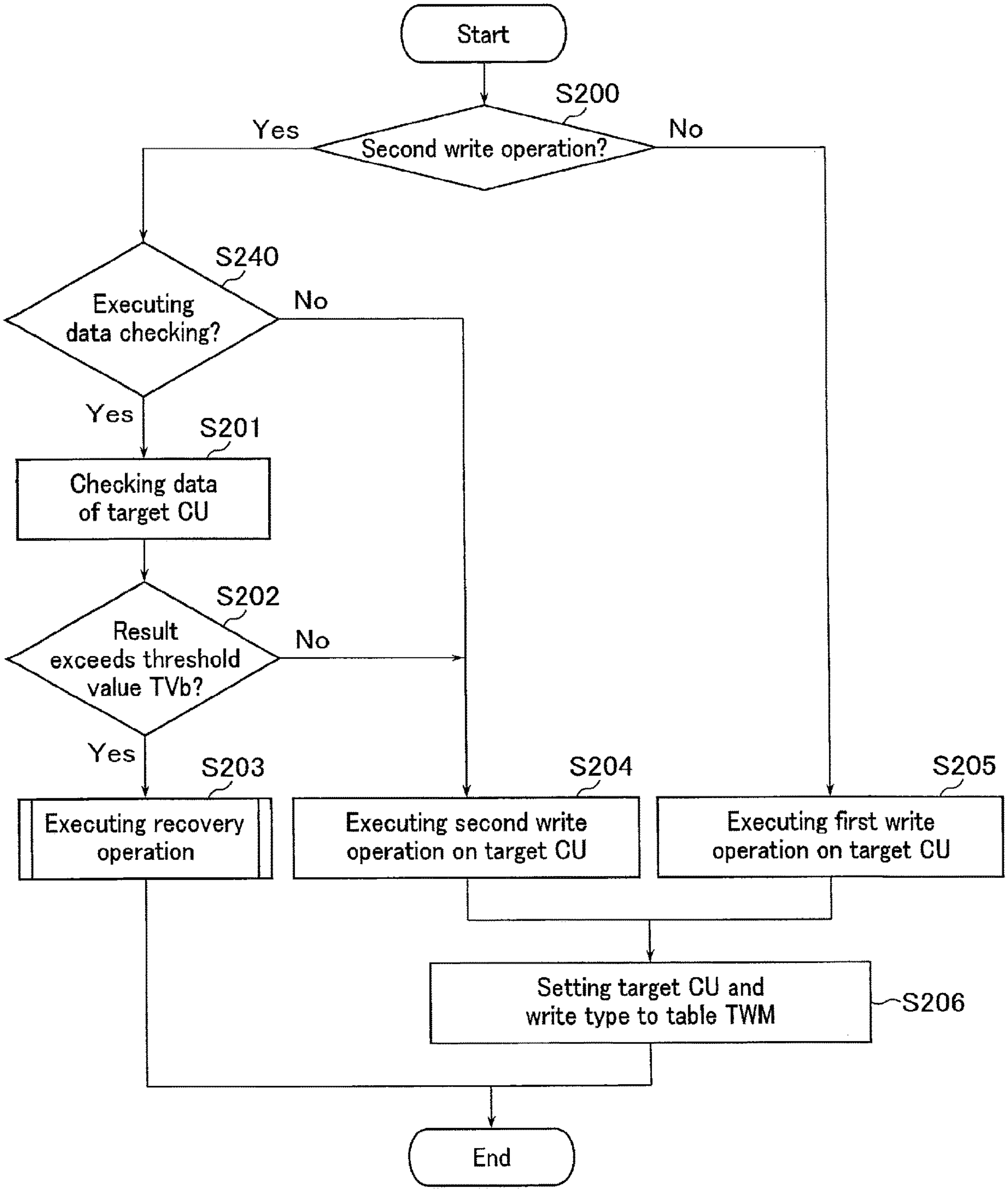
FIG. 22 is a flowchart illustrating an example of a data write operation in a memory system according to a second modification of the second embodiment.

The data write operation will be described with reference to FIG. 22. FIG. 22 is a flowchart illustrating an example of the data write operation.

In the case where the second write operation is to be executed on a target cell unit CU on which the first write operation has been executed (S200_Yes), the memory controller 10 executes the data checking determination operation (S240). The data checking determination operation will be described later in detail.

In the case where the memory controller 10 determines that checking on the lower page data and the middle page data of the target cell unit CU is to be executed (S240_Yes), the data checking circuit 40 checks the lower page data and the middle page data of the target cell unit CU(S201).

On the other hand, in the case where the memory controller 10 determines that there is no need to execute checking on the lower page data and the middle page data of the target cell unit CU(S240_No), the sequencer 36 executes the second write operation on the target cell unit CU based on the upper page data and the top page data input from the memory controller 10 to the sense amplifier module 39, and the lower page data and the middle page data read from the memory cell array 31 to the sense amplifier module 39 and stored in the data latch 41 (S204).

The processing from step S200 to step S206 other than step S240 and the processing from steps 210 to S220 are similar to those of the second embodiment described with reference to FIG. 19 and FIG. 20.

2-7-2 Data Checking Determination Operation

The memory controller 10 determines whether to execute the data checking by the data checking circuit 40, based on an elapsed time period T2 from the execution of the first write operation on the target cell unit CU, for example. Specifically, the memory controller 10 determines whether or not the elapsed time period T2 from the execution of the first write operation on the plurality of memory cells MC in the target cell unit CU exceeds a threshold value TVc. In the case of the elapsed time period T2 exceeding the threshold value TVc, the memory controller 10 determines that the data checking by the data checking circuit 40 is to be executed. The threshold value TVc is set to, for example, an appropriate value (time period) by the memory controller 10.

In order to calculate the time period T2, the write history table T1H described in the first embodiment may be prepared.

2-7-3 Effects

The present modification produces effects similar to those of the second embodiment.

Furthermore, in the present modification, at the time of execution of the second write operation, the memory controller 10 determines whether or not the elapsed time period T2 from the execution of the first write operation on the target cell unit CU exceeds the threshold value TVc. In the case of the elapsed time period T2 exceeding the threshold value TVc, the data checking circuit 40 checks the lower page data and the middle page data of the target cell unit CU. For this reason, the data checking circuit 40 does not check data of the target cell unit CU every time the second write operation is executed. Thus, the configuration according to the present modification can suppress deterioration in the processing performance of the second write operation.

2-8 Third Modification

A memory system according to a third modification of the second embodiment will be described. The memory system 1 according to the present modification differs from that of the second embodiment in terms of containing a number-of-writes table TWN. Furthermore, the memory system 1 according to the present modification differs from that of the second modification of the second embodiment in terms of the data checking determination operation. Hereinafter, the following description will in principle focus on the features different from the second modification of the second embodiment.

2-8-1 Configuration of Memory System

Figure 23:
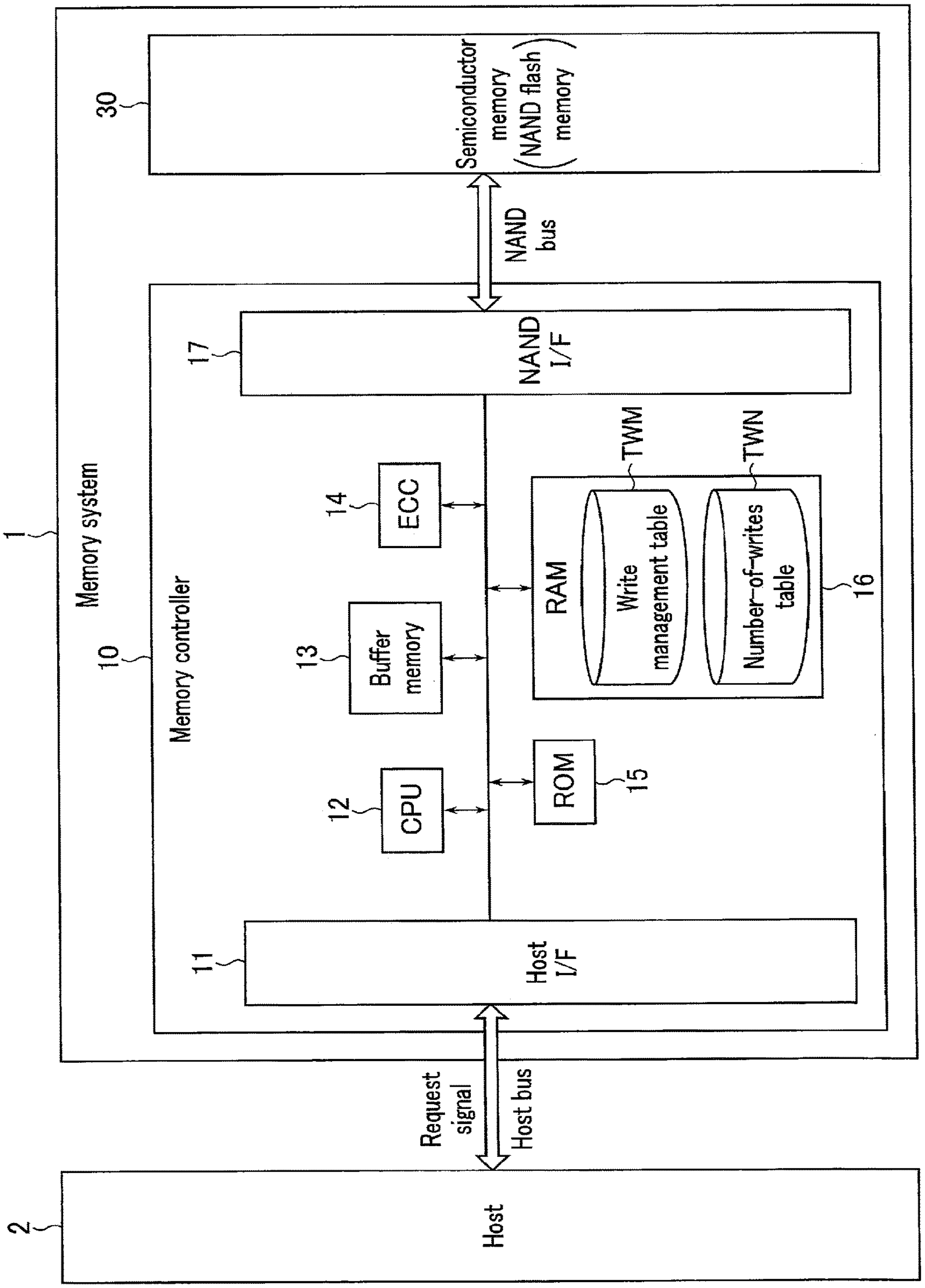
FIG. 23 is a block diagram illustrating an example of an information processing system including a memory system according to a third modification of the second embodiment.

The configuration of the memory system 1 will be described with reference to FIG. 23. FIG. 23 is a block diagram illustrating an example of the information processing system including the memory system 1.

The memory system 1 further includes a number-of-writes table TWN. The number-of-writes table TWN is stored in, for example, the RAM 16. The number-of-writes table TWN will be described later in detail. The rest of the configuration of the memory system 1 is similar to that of the second embodiment described with reference to FIG. 17.

2-8-2 Number-of-Writes Table

The number-of-writes table TWN will be described with reference to FIG. 24. FIG. 24 is a conceptual diagram illustrating an example of the number-of-writes table TWN.

The number-of-writes table TWN stores the number of times a data write operation is executed, for each block BLK.

As illustrated in FIG. 24, each of entries of the number-of-writes table TWN includes a block BLK and the number of times the data write operation is executed on the block BLK (hereinafter, referred to as "the number of writes").

In the example illustrated in FIG. 24, the data write operation is executed 100 times for each of the blocks BLK0 and BLK1.

When a block BLK is selected as a write destination block BLK, the number of writes on the block BLK is counted up, and the counted-up number is written into the number-of-writes table TWN as the number of writes on the block BLK.

The number-of-writes table TWN is stored in one of the blocks BLK in the NAND flash memory 30, for example. The number-of-writes table TWN is loaded from the NAND flash memory 30 to the RAM 16, for example, immediately after the memory system 1 is powered on. When the memory system 1 is powered off, the number-of-writes table TWN stored in the RAM 16 is written in one of the blocks BLK in the NAND flash memory 30.

2-8-3 Data Checking Determination Operation

The memory controller 10 determines whether to execute the data checking by the data checking circuit 40, for example, based on the number of writes or the number of data erase operations with respect to the write destination block BLK (hereinafter, referred to as "the number of erasures") including the target cell unit CU(for example, based on the number of writes stored in the number-of-writes table TWN). Specifically, the memory controller 10 determines whether or not the number of writes or the number of erasures N1 with respect to the write destination block BLK including the target cell unit CU exceeds a threshold value TVd. In the case of the number of writes or the number of erasures N1 exceeding the threshold value TVd, the memory controller 10 determines that the data checking is to be executed. The threshold value TVd is set to, for example, an appropriate value (number of times) by the memory controller 10.

Meanwhile, wear leveling may allow all of the blocks BLK in the memory system 1 to be substantially equal to each other in the number of writes or the number of erasures N1. In such a case, for example, after detecting the fact that the number of writes or the number of erasures N1 with respect to a block BLK exceeds the threshold value TVd, the memory controller 10 may omit the data checking determination operation and determine that the data checking by the data checking circuit 40 is to be executed. Alternatively, based on the precondition that all blocks BLK are substantially equal in the number of erasures N1, the memory controller 10 may use the average number of erasures Ave_N1 in a drive for a comparison with the threshold value TVd. In this case, after detecting the fact that the average number of erasures Ave_N1 exceeds the threshold value TVd, the memory controller 10 omits the data checking determination operation and executes the data checking on all blocks BLK.

2-8-4 Effects

The present modification produces effects similar to those of the second modification of the second embodiment.

2-9 Fourth Modification

A memory system according to a fourth modification of the second embodiment will be described. The memory system 1 according to the present modification differs from the second embodiment in terms of containing a number-of-errors table TEN. Furthermore, the memory system 1 according to the present modification differs from that of the second modification of the second embodiment in terms of the data checking determination operation. Hereinafter, the following description will in principle focus on the features different from the second modification of the second embodiment.

2-9-1 Configuration of Memory System

Figure 25:
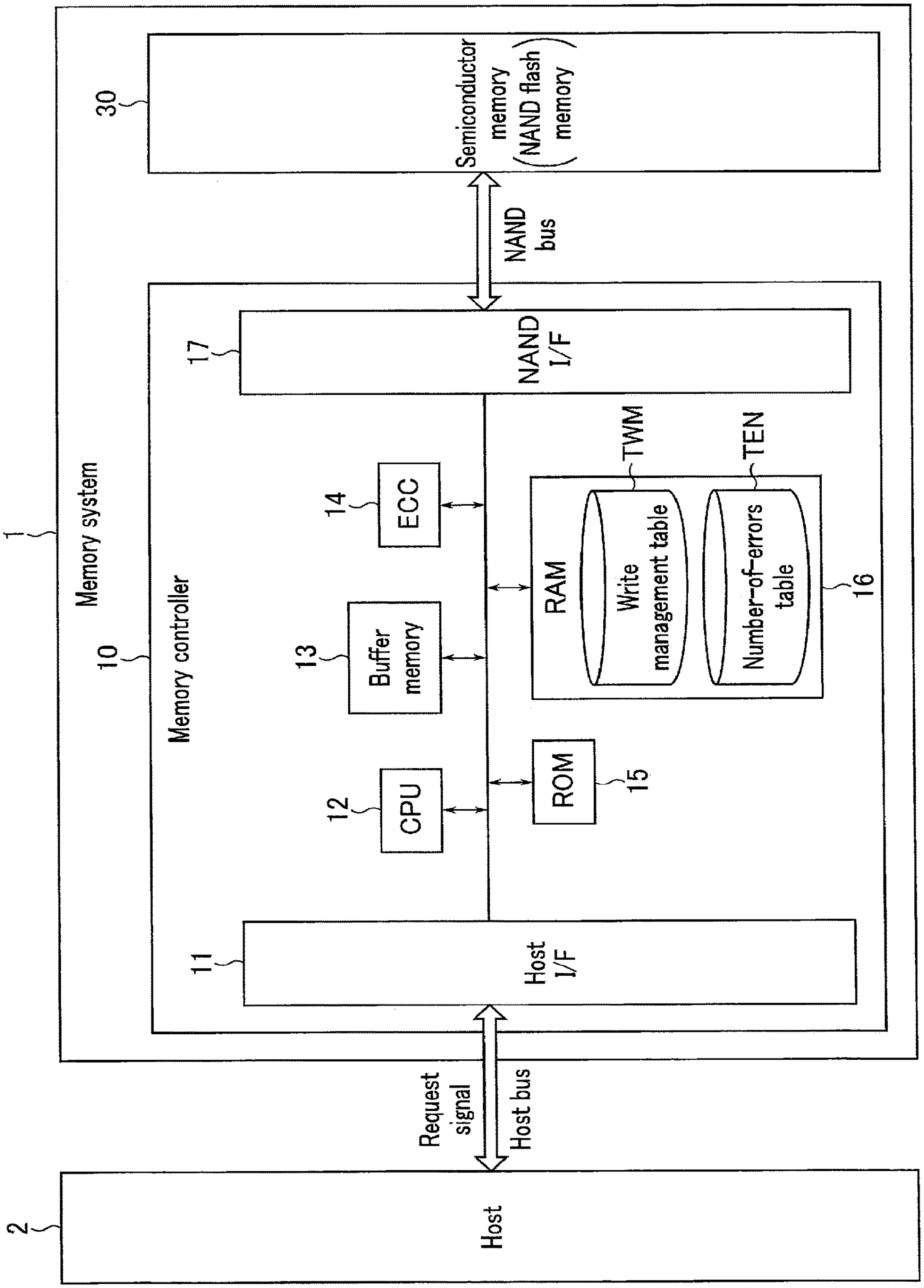
FIG. 25 is a block diagram illustrating an example of an information processing system including a memory system according to a fourth modification of the second embodiment.

The configuration of the memory system 1 will be described with reference to FIG. 25. FIG. 25 is a block diagram illustrating an example of the information processing system including the memory system 1.

The memory system 1 further includes the number-of-errors table TEN. The number-of-errors table TEN will be described later in detail. The number-of-errors table TEN is stored in, for example, the RAM 16. The rest of the configuration of the memory system 1 is similar to that of the second embodiment described with reference to FIG. 17.

2-9-2 Number-of-errors Table

The number-of-errors table TEN will be described with reference to FIG. 26. FIG. 26 is a conceptional diagram illustrating an example of the number-of-errors table TEN.

The number-of-errors table TEN stores, for each block BLK, the number of times an error is detected in data read from the NAND flash memory 30 to the memory controller 10. An error is detected through, for example, the ECC processing by the ECC circuit 14.

As illustrated in FIG. 26, each of entries of the number-of-errors table TEN includes a block BLK and the number of times an error is detected in the block BLK (hereinafter, referred to as "the number of error detections").

In the example illustrated in FIG. 26, an error is detected 10 times in the block BLK0. In the block BLK1, an error is detected 20 times.

When an error is detected in data read from a block BLK, the number of error detections on the block BLK is counted up, and the counted-up number is written into the number-of-errors table TEN as the number of error detections on the block BLK.

The number-of-errors table TEN is stored in, for example, one of the blocks BLK in the NAND flash memory 30. The number-of-errors table TEN is loaded from the NAND flash memory 30 to the RAM 16, for example, immediately after the memory system 1 is powered on. When the memory system 1 is powered off, the number-of-errors table TEN stored in the RAM 16 is written in one of the blocks BLK in the NAND flash memory 30.

2-9-3 Data Checking Determination Operation

The memory controller 10 determines whether to execute the data checking by the data checking circuit 40, based on a past error history of the write destination block BLK including the target cell unit CU(for example, based on the number of error detections stored in the number-of-errors table TEN). Specifically, the memory controller 10 determines whether or not the number of past error detections N2 of the write destination block BLK including the target cell unit CU exceeds a threshold value TVe. In the case of the number of error detections N2 exceeding the threshold value TVe, the memory controller 10 determines that the data checking is to be executed. The threshold value TVe is set to, for example, an appropriate value (number of times) by the memory controller 10. Note that, the present modification described the number-of-errors table TEN storing the number of error detections for each block BLK; however, the number-of-errors table TEN may store the number of error detections for each word line WL in the block BLK. In this case, the data checking determination operation is performed based on a past error history for each word line WL in the block BLK.

The memory controller 10 may determine whether to execute the data checking by the data checking circuit 40, based on a correction capability of the ECC circuit 14, for example. In this case, in the case where an indicator indicating the correction capability of the ECC circuit 14 configured to perform the ECC processing on data of a target cell unit CU exceeds a threshold value TVf, the memory controller 10 determines that the data checking is to be executed. The threshold value TVf is set to, for example, an appropriate value by the memory controller 10.

The memory controller 10 may determine that the data checking by the data checking circuit 40 is to be executed, by using the past error history in combination with the correction capacity of the ECC circuit 14.

2-9-4 Effects

The present modification produces effects similar to those of the second modification of the second embodiment.

3. Third Embodiment

A third embodiment will be described. The memory system 1 according to the present embodiment differs from that of the second embodiment in terms of a data write operation. The present embodiment will describe the data write operation in the case where there are a relatively large number of error bits in the lower page data or the middle page data of a cell unit CU on which the first write operation has been executed. As an example, the present embodiment performs the second write operation based on the upper page data and the top page data after execution of pre-processing of the second write operation based on padding data, with respect to the target cell unit CU on which the first write operation has been executed. Hereinafter, the following description will in principle focus on the features different from the second embodiment.

3-1 Data Write Operation

Figure 27:
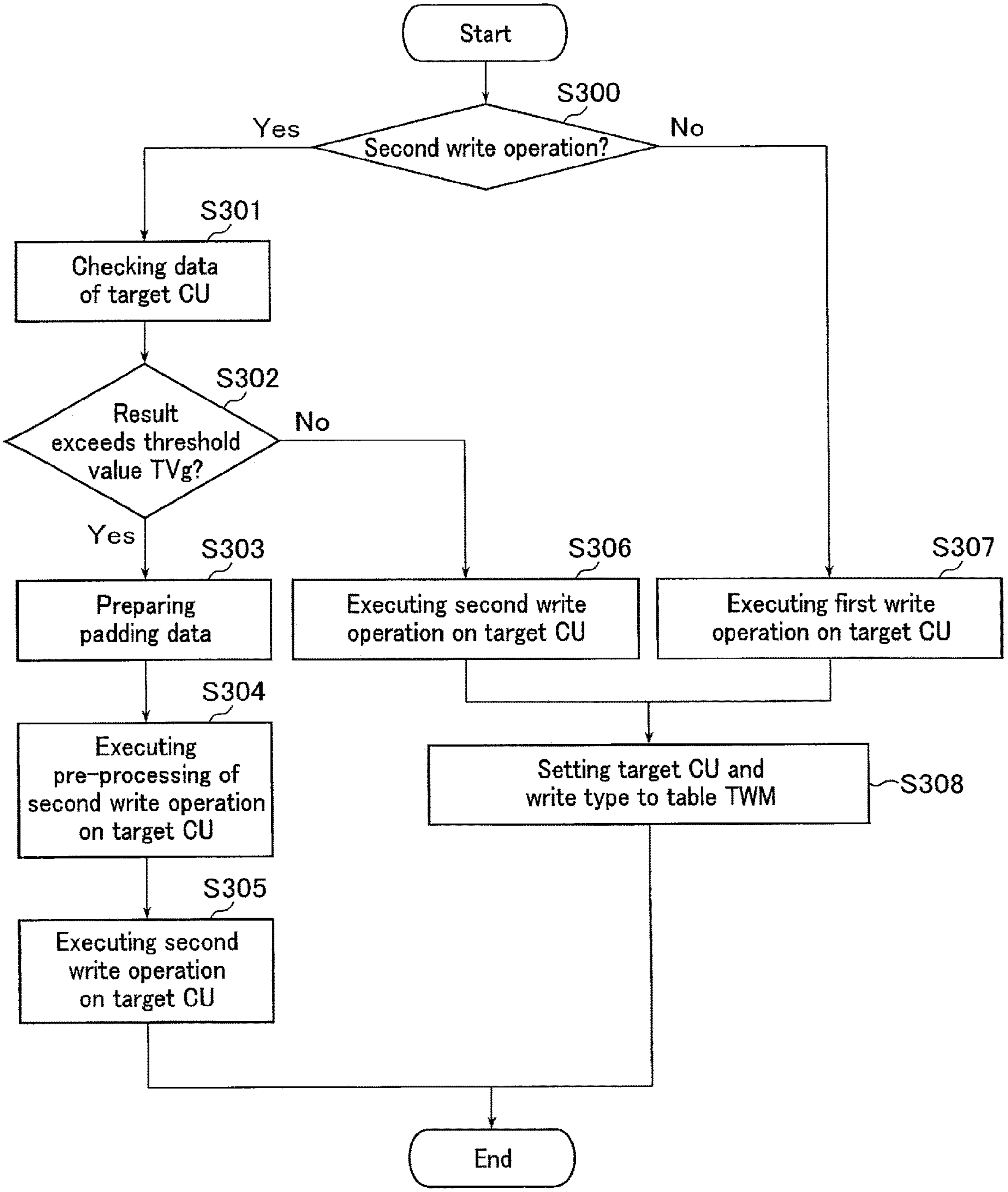
FIG. 27 is a flowchart illustrating an example of a data write operation of a memory system according to a third embodiment.

The data write operation will be described with reference to FIG. 27. FIG. 27 is a flowchart illustrating an example of the data write operation.

When the memory controller 10 receives the lower page data and the middle page data or the upper page data and the top page data from the host 2, the processing from step S300 to S308 is executed in accordance with the write order described in the first embodiment.

Steps S300, S301, S306, S307, and S308 are the same as steps S200, S201, S204, S205, and S206 illustrated in FIG. 19 described in the second embodiment, respectively.

Upon receipt of a check result through the processing at step S301 from the data checking circuit 40, the memory controller 10 determines whether or not the check result (that is, the number of error bits detected by the data checking circuit 40) exceeds a threshold value TVg (S302). The threshold value TVg is, for example, 100 bits.

In the case of the check result not exceeding the threshold value TVg (S302_No), the sequencer 36 executes the second write operation on the target cell unit CU based on the upper page data and the top page data input from the memory controller 10 to the sense amplifier module 39, and the lower page data and the middle page data read from the memory cell array 31 to the sense amplifier module 39 and stored in the data latch 41 (S306).

On the other hand, in the case of the check result exceeding the threshold value TVg, that is, in the case of a relatively large number of error bits (S302_Yes), the memory controller 10 prepares padding data for use in the pre-processing of the second write operation on the target cell unit CU(S303).

For example, the padding data is data obtained by setting all pieces of the lower page data of the target cell unit CU to "0" data and all pieces of the middle page data of the target cell unit CU to "1" data. Each piece of the padding data used herein is not randomized data but data indicative of all "0" data or all "1" data when it is written into the target cell unit CU. In other words, out of the lower page data, the middle page data, the upper page data, and the top page data which are written into the target cell unit CU, the present embodiment replaces the lower page data and the middle page data having a relatively large number of error bits with the padding data.

When the padding data is prepared, the sequencer 36 executes the pre-processing of the second write operation on the target cell unit CU based on the padding data (the lower page data and the middle page data) input from the memory controller 10 to the sense amplifier module 39 (S304). The pre-processing of the second write operation is performed by the sequencer 36 executing the data write operation to cause threshold voltages of the respective memory cells MC in the target cell unit CU to transition to the "M3" state. Remember that all of the memory cells MC in the target cell unit CU after the first write operation exhibit threshold voltages equal to or lower than the "M3" state. Thus, the sequencer 36 can cause the threshold voltages of the respective memory cells MC in the target cell unit CU to transition to the "M3" state by performing the pre-processing of the second write operation. The pre-processing of the second write operation may be implemented by the first write operation.

Upon completion of the pre-processing of the second write operation on the target cell unit CU, the sequencer 36 executes the second write operation on the target cell unit CU based on the upper page data and the top page data input from the memory controller 10 to the sense amplifier module 39, and the padding data (the lower page data and the middle page data) (S305). That is, the sequencer 36 executes the data write operation to cause threshold voltages of the respective memory cells MC in the target cell unit CU to transition to one of the "S12" state to the "S15" state.

Note that, in the case where the number of error bits exceeds a predetermined number as a result of checking by the data checking circuit 40, the memory controller 10 may designate a write destination block BLK to be written, as a bad block (unwritable block BLK).

Furthermore, before the processing at step S301, the memory controller 10 may execute the data checking determination operation described in the second modification to the fourth modification of the second embodiment.

3-2 Effects

As described in the first embodiment, when the memory cell MC is left for a relatively long time after the first write operation is executed thereon, a bit error in data stored in the memory cell MC may occur.

In the present embodiment, at the time of execution of the second write operation, the data check circuit 40 executes checking on the lower page data and the middle page data of the target cell unit CU on which the first write operation has been executed. In the case of the check result exceeding the threshold value TVg, that is, in the case of a relatively large number of error bits, the sequencer 36 executes the data write operation to cause threshold voltages of the respective memory cells MC in the target cell unit CU to transition to one of the "S12" state to the "S15" state. In this manner, the data write operation can be executed on the target cell unit CU based on valid data (i.e., the upper page data and the top page data).

4. Modifications, Etc

As described above, a memory system (1) according to an embodiment includes a semiconductor memory (30), a controller (10), and a first circuit (40). The semiconductor memory (30) includes at least one memory cell (MC) configured to nonvolatilely store data having at least two bits. The controller (10) is configured to cause the semiconductor memory (30) to execute a first write operation and a second write operation. The first write operation writes a first bit (lower/middle) into the memory cell (MC). The second write operation writes first data (lower/middle/upper/top) into the memory cell (MC). The first data has at least two bits based on the first bit (lower/middle) read from the memory cell (MC) and a second bit (upper/top). The first circuit (40) checks whether or not the first bit (lower/middle) read from the memory cell (MC) includes a bit error. The controller (10) is configured to cause the semiconductor memory (30) to execute, in the second write operation, writing of the first data (lower/middle/upper/top) that includes the second bit and a third bit (lower/middle) which is obtained by correcting the bit error of the first bit (lower/middle), in a case that the first bit (lower/middle) read from the memory cell includes the bit error based on a result of checking by the first circuit (40).

The embodiments are not limited to those described in the above, and various modifications may be made.

The order of the steps in the flowcharts described in the above embodiments may be altered to the extent possible.

Furthermore, the data checking circuit 40 according to the second modification to the fourth modification of the second embodiment and the third embodiment may be the circuit described in the first modification of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
- a semiconductor memory including at least one memory cell configured to nonvolatilely store data having at least two bits;
- a controller configured to cause the semiconductor memory to execute:
  - a first write operation of writing a first bit into the memory cell; and
  - a second write operation of writing first data into the memory cell, the first data having at least two bits based on the first bit read from the memory cell and a second bit; and
- a first circuit configured to check whether or not the first bit read from the memory cell includes a bit error,
- wherein the controller is configured to cause the semiconductor memory to execute, in the second write operation, writing of the first data that includes the second bit and a third bit, the third bit being obtained by correcting the bit error of the first bit, in a case that the first bit read from the memory cell includes the bit error based on a result of checking by the first circuit.

2. The memory system according to claim 1, wherein the controller is further configured to determine whether to execute the checking by the first circuit, in executing the second write operation on the memory cell on which the first write operation has been executed.

3. The memory system according to claim 2, wherein the controller is configured to determine whether to execute the checking by the first circuit, based on an elapsed time period from execution of the first write operation.

4. The memory system according to claim 1, wherein the memory cell is configured to nonvolatilely store the data in accordance with a threshold voltage,
- the first bit corresponds to a first threshold voltage, and
- the first data, which includes the second bit and the third bit, corresponds to a second threshold voltage higher than the first threshold voltage.

5. The memory system according to claim 3, wherein the controller is configured to determine to execute the checking by the first circuit, in a case where the elapsed time period from the execution of the first write operation is longer than a threshold.

6. The memory system according to claim 1, wherein
- the controller is connected to the semiconductor memory via a bus and includes the first circuit, and
- the controller is further configured to:
  - determine whether to receive the first bit read from the memory cell, in executing the second write operation on the memory cell on which the first write operation has been executed; and
  - in a case where the controller receives the first bit read from the memory cell, check, by using the first circuit, whether or not the first bit read from the memory cell includes the bit error.

7. The memory system according to claim 6, wherein the controller is configured to determine whether to receive the first bit read from the memory cell, based on an elapsed time period from execution of the first write operation.

8. The memory system according to claim 7, wherein the controller is configured to determine to receive the first bit read from the memory cell, in a case where the elapsed time period from the execution of the first write operation is longer than a threshold.

9. A method of controlling a semiconductor memory that includes at least one memory cell configured to nonvolatilely store data having at least two bits, comprising:
- causing the semiconductor memory to execute a first write operation of writing a first bit into the memory cell;
- causing the semiconductor memory to execute a second write operation of writing first data into the memory cell, the first data having at least two bits based on the first bit read from the memory cell and a second bit; and
- checking whether or not the first bit read from the memory cell includes a bit error,
- wherein the semiconductor memory is caused to execute, in the second write operation, writing of the first data that includes the second bit and a third bit, the third bit being obtained by correcting the bit error of the first bit, in a case that the first bit read from the memory cell includes the bit error.

10. The method according to claim 9, further comprising:
- determining whether to execute the checking of the error bit, in executing the second write operation on the memory cell on which the first write operation has been executed.

11. The method according to claim 10, wherein whether to execute the checking of the error bit is determined based on an elapsed time period from execution of the first write operation.

12. The method according to claim 11, wherein the checking of the error bit is determined to be executed in a case where the elapsed time period from the execution of the first write operation is longer than a threshold.

13. The method according to claim 9, wherein the method is executed by a controller that is connected to the semiconductor memory via a bus and includes a first circuit, and the method further comprises:

determining whether to receive the first bit read from the memory cell, in executing the second write operation on the memory cell on which the first write operation has been executed; and in a case where the first bit read from the memory cell is received, checking, by using the first circuit, whether or not the first bit read from the memory cell includes the bit error.

14. The method according to claim 13, wherein whether to receive the first bit read from the memory cell is determined based on an elapsed time period from execution of the first write operation.

15. The method according to claim 14, wherein the first bit read from the memory cell is determined to be received in a case where the elapsed time period from the execution of the first write operation is longer than a threshold.

16. The method according to claim 9, wherein the memory cell is configured to nonvolatilely store the data in accordance with a threshold voltage, the first bit corresponds to a first threshold voltage, and the first data, which includes the second bit and the third bit, corresponds to a second threshold voltage higher than the first threshold voltage.

17. The memory system according to claim 2, wherein the controller is configured to determine whether to execute the checking by the first circuit, based on a number of data write operations performed on the memory cell or a number of data erase operations performed on the memory cell.

18. The memory system according to claim 2, wherein the controller is configured to determine whether to execute the checking by the first circuit, based on a number of past error detections of the memory cell.

19. The method according to claim 10, wherein whether to execute the checking of the error bit is determined based on a number of data write operations performed on the memory cell or a number of data erase operations performed on the memory cell.

20. The method according to claim 10, wherein whether to execute the checking of the error bit is determined based on a number of past error detections of the memory cell.

* * * * *